(12) United States Patent
Kashiwazaki

(10) Patent No.: US 11,044,799 B2
(45) Date of Patent: Jun. 22, 2021

(54) EXTREME ULTRAVIOLET LIGHT GENERATION APPARATUS AND ELECTRONIC DEVICE MANUFACTURING METHOD

(71) Applicant: Gigaphoton Inc., Tochigi (JP)

(72) Inventor: Tsutomu Kashiwazaki, Oyama (JP)

(73) Assignee: Gigaphoton Inc., Tochigi (JP)

( * ) Notice: Subject to any disclaimer, the term of this patent is extended or adjusted under 35 U.S.C. 154(b) by 0 days.

(21) Appl. No.: 16/898,229

(22) Filed: Jun. 10, 2020

(65) Prior Publication Data

US 2020/0305264 A1    Sep. 24, 2020

Related U.S. Application Data

(63) Continuation of application No. PCT/JP2018/003011, filed on Jan. 30, 2018.

(51) Int. Cl.
  *H05G 2/00* (2006.01)
  *G03F 7/20* (2006.01)

(52) U.S. Cl.
  CPC .......... *H05G 2/008* (2013.01); *G03F 7/2043* (2013.01); *G03F 7/70033* (2013.01); *G03F 7/70925* (2013.01); *H05G 2/003* (2013.01)

(58) Field of Classification Search
  CPC ........ H05G 2/008; H05G 2/003; H05G 2/005; G03F 7/70033; G03F 7/70916; G03F 7/20; G03F 7/2043; G03F 7/70925
  USPC .................................................. 250/504 R
  See application file for complete search history.

(56) References Cited

U.S. PATENT DOCUMENTS

2008/0179548 A1* 7/2008 Bykanov ............. G03F 7/70033
                                                250/504 R
2010/0176310 A1   7/2010 Moriya et al.
2013/0319466 A1  12/2013 Mizoguchi et al.
2017/0238407 A1   8/2017 Nagai et al.
                    (Continued)

FOREIGN PATENT DOCUMENTS

JP    2010-161318 A    7/2010
JP    2013-251381 A   12/2013
JP    2016-018701 A    2/2016
                    (Continued)

OTHER PUBLICATIONS

International Search Report issued in PCT/JP2018/003011; dated Apr. 10, 2018.
Written Opinion issued in PCT/JP2018/003011 dated Apr. 10, 2018.

*Primary Examiner* — Kiet T Nguyen
(74) *Attorney, Agent, or Firm* — Studebaker & Brackett PC

(57) ABSTRACT

An extreme ultraviolet light generation apparatus includes a chamber (10) having an internal space in which extreme ultraviolet light is generated when a target substance supplied to the internal space is irradiated with a laser beam (301), a gas supply unit (63) configured to supply etching gas to the internal space, a discharge unit (61) configured to discharge residual gas from the internal space, a pressure sensor (26) configured to measure a pressure in the internal space, and a control unit (20), and the control unit (20) may predict a time until the pressure in the internal space reaches a predetermined pressure by using a relation between an elapsed time since start of a predetermined duration including a duration in which the extreme ultraviolet light is generated and a pressure measured in the predetermined duration.

20 Claims, 17 Drawing Sheets

(56) References Cited

U.S. PATENT DOCUMENTS

2018/0224748 A1 8/2018 Nagai et al.
2020/0341383 A1* 10/2020 Iwamoto ............... H05G 2/008

FOREIGN PATENT DOCUMENTS

| WO | 2016/098193 A1 | 6/2016 |
| WO | 2017/077641 A1 | 5/2017 |

* cited by examiner

EXTREME ULTRAVIOLET LIGHT GENERATION APPARATUS AND ELECTRONIC DEVICE MANUFACTURING METHOD

CROSS-REFERENCE TO RELATED APPLICATIONS

The present application is a continuation application of International Application No. PCT/JP2018/003011, filed on Jan. 30, 2018, the entire contents of which are hereby incorporated by reference.

BACKGROUND

1. Technical Field

The present disclosure relates to an extreme ultraviolet light generation apparatus and an electronic device manufacturing method.

2. Related Art

Recently, miniaturization of a transfer pattern in optical lithography of a semiconductor process has been rapidly proceeding along with miniaturization of the semiconductor process. Minute fabrication at 20 nm or smaller will be requested in the next generation technology. To meet the request for minute fabrication at 20 nm or smaller, for example, it is desired to develop an exposure device including an extreme ultraviolet light generation apparatus configured to generate extreme ultraviolet (EUV) light at a wavelength of 13 nm approximately in combination with reduced projection reflective optics.

Disclosed EUV light generation devices include the three kinds of devices of a laser produced plasma (LPP) device that uses plasma generated by irradiating a target material with a pulse laser beam, a discharge produced plasma (DPP) device that uses plasma generated by electrical discharge, and a synchrotron radiation (SR) device that uses synchrotron radiation.

LIST OF DOCUMENTS

Patent Document

Patent Document 1: International Patent Publication No. 2017/077641

SUMMARY

An extreme ultraviolet light generation apparatus according to an aspect of the present disclosure includes a chamber having an internal space in which extreme ultraviolet light is generated when a target substance supplied to the internal space is irradiated with a laser beam, a gas supply unit configured to supply etching gas to the internal space, a discharge unit configured to discharge residual gas from the internal space, a pressure sensor configured to measure a pressure in the internal space, and a control unit, and the control unit may predict a time until the pressure in the internal space reaches a predetermined pressure by using a relation between an elapsed time since start of a predetermined duration including a duration in which extreme ultraviolet light is generated and the pressure measured in the predetermined duration.

An extreme ultraviolet light generation apparatus according to another aspect of the present disclosure includes a chamber having an internal space in which extreme ultraviolet light is generated when a target substance supplied to the internal space is irradiated with a laser beam, a gas supply unit configured to supply etching gas to the internal space, a discharge unit configured to discharge residual gas from the internal space, a pressure sensor configured to measure a pressure in the internal space, and a control unit, and the control unit may predict the number of repetitions of light emission operation of the extreme ultraviolet light until the pressure in the internal space reaches a predetermined pressure by using a relation between the number of repetitions of light emission operation of the extreme ultraviolet light since start of a predetermined duration including a duration in which the extreme ultraviolet light is generated and the pressure measured in the predetermined duration.

An electronic device manufacturing method according to another aspect of the present disclosure includes generating extreme ultraviolet light by an extreme ultraviolet light generation apparatus, outputting the extreme ultraviolet light to an exposure apparatus, and exposing a photosensitive substrate to the extreme ultraviolet light in the exposure apparatus to manufacture an electronic device, the extreme ultraviolet light generation apparatus includes a chamber having an internal space in which extreme ultraviolet light is generated when a target substance supplied to the internal space is irradiated with a laser beam, a gas supply unit configured to supply etching gas to the internal space, a discharge unit configured to discharge residual gas from the internal space, a pressure sensor configured to measure a pressure in the internal space, and a control unit, and the control unit may predict the number of repetitions of light emission operation of the extreme ultraviolet light until the pressure in the internal space reaches a predetermined pressure by using a relation between the number of repetitions of light emission operation of the extreme ultraviolet light since start of a predetermined duration including a duration in which the extreme ultraviolet light is generated and the pressure measured in the predetermined duration.

BRIEF DESCRIPTION OF THE DRAWINGS

Embodiments of the present disclosure will be described below as examples with reference to the accompanying drawings.

DESCRIPTION OF EMBODIMENTS

1. Overview
2. Description of electronic device manufacturing device
3. Description of extreme ultraviolet light generation apparatus of comparative example
   3.1 Configuration of extreme ultraviolet light generation apparatus of comparative example
   3.2 Operation of extreme ultraviolet light generation apparatus of comparative example
   3.3 Problem
4. Embodiment 1
   4.1 Configuration of extreme ultraviolet light generation apparatus of Embodiment 1
   4.2 Operation of extreme ultraviolet light generation apparatus of Embodiment 1
   4.3 Effect
5. Embodiment 1
   5.1 Configuration of extreme ultraviolet light generation apparatus of Embodiment 2
   5.2 Operation of extreme ultraviolet light generation apparatus of Embodiment 2
   5.3 Effect
6. Embodiment 3
   6.1 Operation of extreme ultraviolet light generation apparatus of Embodiment 3
   6.2 Effect
7. Embodiment 4
   7.1 Operation of extreme ultraviolet light generation apparatus of Embodiment 4
   7.2 Effect
8. Embodiment 5
   8.1 Operation of extreme ultraviolet light generation apparatus of Embodiment 5
   8.2 Effect
9. Embodiment 6
   9.1 Operation of extreme ultraviolet light generation apparatus of Embodiment 6
   9.2 Effect Embodiments of the present disclosure will be described below in detail with reference to the accompanying drawings.

The embodiments described below are examples of the present disclosure, and do not limit the contents of the present disclosure. Not all configurations and operations described in each embodiment are necessarily essential as configurations and operations of the present disclosure. Components identical to each other are denoted by an identical reference sign, and duplicate description thereof will be omitted.

1. Overview

The embodiments of the present disclosure relate to an extreme ultraviolet light generation apparatus configured to generate light having a wavelength corresponding to so-called extreme ultraviolet (EUV) and an electronic device manufacturing device. In the present specification below, extreme ultraviolet light is also referred to as EUV light.

2. Description of Electronic Device Manufacturing Device

Figure 1:
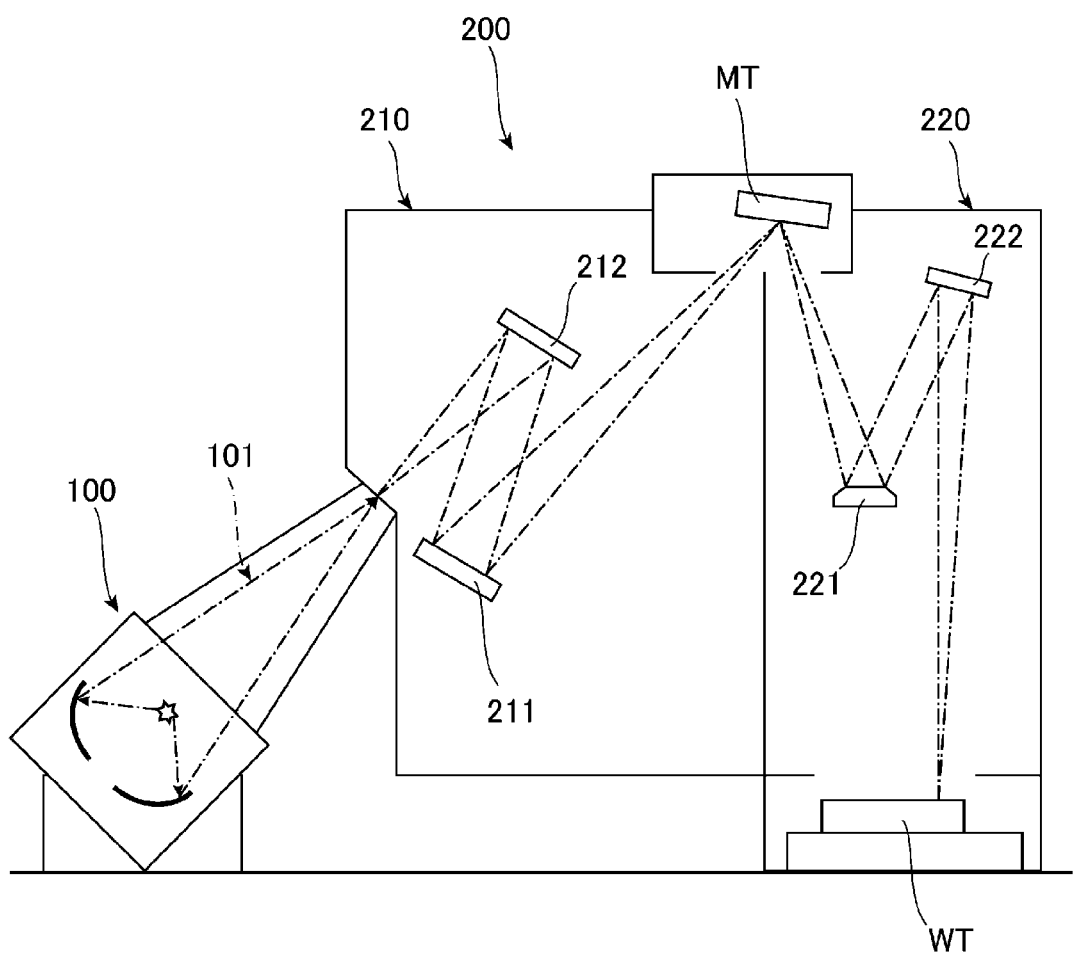
FIG. 1 is a pattern diagram illustrating an exemplary entire schematic configuration of an electronic device manufacturing device.

As illustrated in FIG. 1, the electronic device manufacturing device includes an EUV light generation apparatus 100 and an exposure apparatus 200. The exposure apparatus 200 includes a mask irradiation unit 210 including a plurality of mirrors 211 and 212, and a workpiece irradiation unit 220 including a plurality of mirrors 221 and 222. The mask irradiation unit 210 illuminates, with EUV light 101 incident from the EUV light generation apparatus 100, a mask pattern on a mask table MT through a reflected optical system. The workpiece irradiation unit 220 images, through a reflected optical system, the EUV light 101 reflected by the mask table MT on a workpiece (not illustrated) disposed on a workpiece table WT. The workpiece is a photosensitive substrate such as a semiconductor wafer on which photoresist is applied. The exposure apparatus 200 translates the mask table MT and the workpiece table WT in synchronization with each other to expose the workpiece to the EUV light 101 onto which the mask pattern is reflected. Through an exposure process as described above, a device pattern is transferred onto the semiconductor wafer, thereby manufacturing a semiconductor device.

3. Description of Extreme Ultraviolet Light Generation Apparatus of Comparative Example

Figure 2:
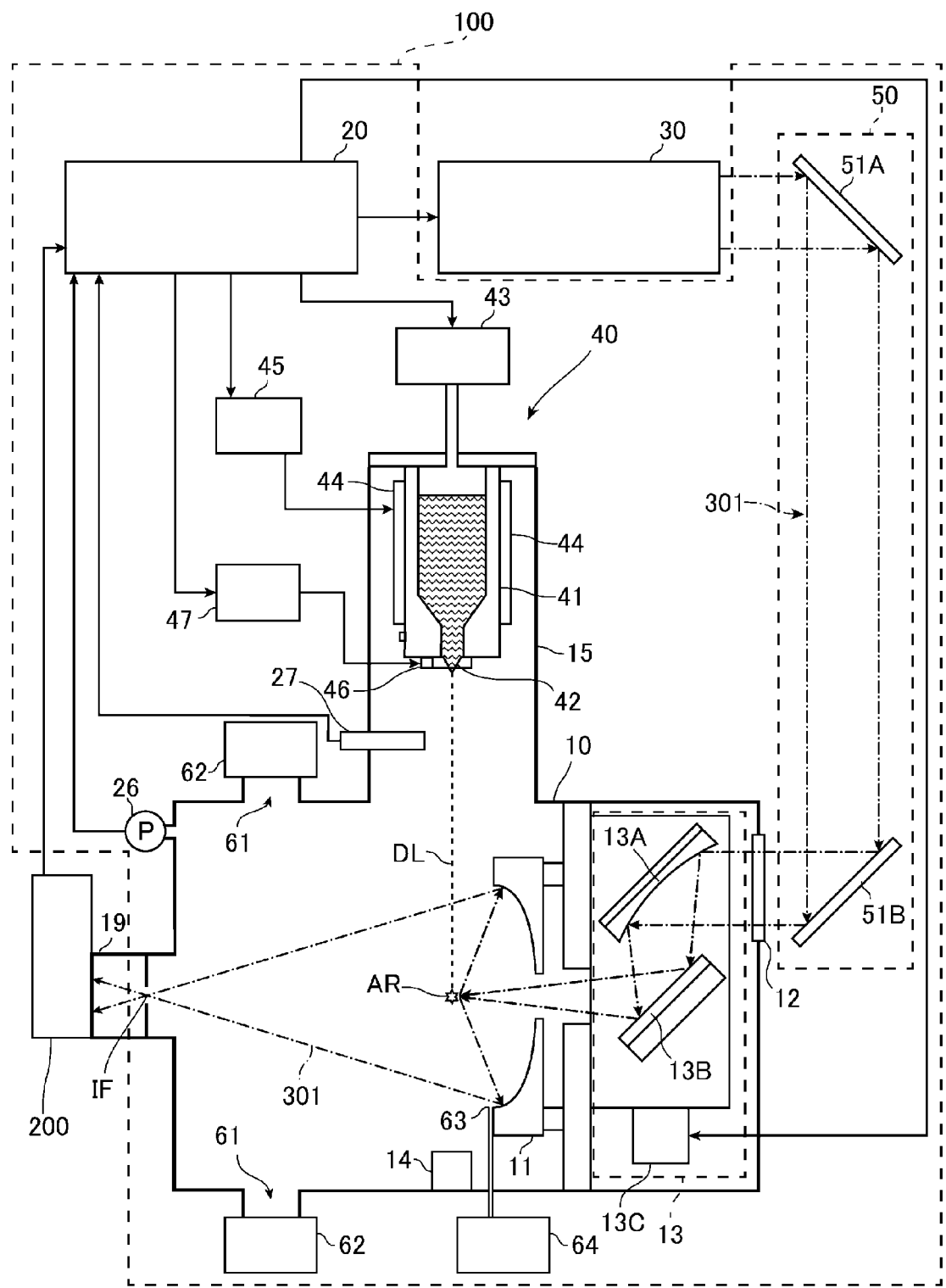
FIG. 2 is a pattern diagram illustrating an exemplary entire schematic configuration of an extreme ultraviolet light generation apparatus.

3.1 Configuration of Extreme Ultraviolet Light Generation Apparatus of Comparative Example FIG. 2 is a pattern diagram illustrating an exemplary entire schematic configuration of the extreme ultraviolet light generation apparatus of the present example. As illustrated in FIG. 2, the EUV light generation apparatus 100 according to the present embodiment is connected with a laser apparatus 30. The EUV light generation apparatus 100 according to the present embodiment includes a chamber 10, a control unit 20, and a laser beam delivery optical system 50.

The chamber 10 is a sealable container. The chamber 10 is provided continuously with a sub chamber 15 including a target supply unit 40. The target supply unit 40 includes a tank 41 and a nozzle 42. The target supply unit 40 supplies a droplet DL to the internal space of the chamber 10 and is attached to, for example, penetrate through the wall of the sub chamber 15. The droplet DL is also called a target and supplied from the target supply unit 40.

The tank 41 stores inside a target substance that becomes the droplet DL. The material of the target may contain tin, terbium, gadolinium, lithium, xenon, or a combination of any two or more of these materials, but is not limited thereto. The inside of the tank 41 is communicated with a pressure adjuster 43 configured to adjust gas pressure through a pipe. A heater 44 is attached to the tank 41. The heater 44 heats the heater 44 by current supplied from a heater power source 45. Through the heating, the target substance in the tank 41 melts. The pressure adjuster 43 and the heater power source 45 are connected with the control unit 20.

The nozzle 42 is attached to the tank 41 and outputs the target substance. A piezoelectric element 46 is attached to the nozzle 42. The piezoelectric element 46 is connected with a piezoelectric power source 47 and driven by voltage applied from the piezoelectric power source 47. The piezoelectric power source 47 is connected with the control unit 20. The target substance output from the nozzle 42 is formed into the droplet DL through operation of the piezoelectric element 46.

The chamber 10 also includes a target collection unit 14. The target collection unit 14 collects any unnecessary droplet DL.

The wall of the chamber 10 is provided with at least one through-hole. The through-hole is blocked by a window 12 through which a laser beam 301 emitted in pulses from the laser apparatus 30 transmits. For example, an EUV light condensing mirror 11 having a spheroidal reflective surface is disposed inside the chamber 10. The EUV light condensing mirror 11 has first and second focal points. For example, a multi-layer reflective film obtained by alternately stacking molybdenum and silicon is formed on the surface of the EUV light condensing mirror 11. The EUV light condensing mirror 11 may be disposed so that, for example, the first focal point is positioned in a plasma generation region AR and the second focal point is positioned at an intermediate focus point IF. A through-hole is provided at a central part of the EUV light condensing mirror 11, and the laser beam 301 in pulses passes through the through-hole.

The EUV light generation apparatus 100 also includes a connection unit 19 that provides communication between the internal space of the chamber 10 and the internal space of the exposure apparatus 200. A wall through which an aperture is formed is provided inside the connection unit 19. The wall is preferably disposed so that the aperture is positioned at the second focal point of the EUV light condensing mirror 11.

The EUV light generation apparatus 100 also includes a pressure sensor 26. The pressure sensor 26 measures the pressure in the internal space of the chamber 10. The EUV light generation apparatus 100 includes a target sensor 27 attached to the chamber 10. The target sensor 27 has, for example, an image capturing function and detects the existence, locus, position, speed, and the like of the droplet DL. The pressure sensor 26 and the target sensor 27 are connected with the control unit 20.

In addition, a laser condensing optical system 13 is disposed in the chamber 10. The laser condensing optical system 13 includes a laser beam condensing mirror 13A and a high reflectance mirror 13B. The laser beam condensing mirror 13A reflects and condenses the laser beam 301 transmitting through the window 12. The high reflectance mirror 13B reflects the light condensed by the laser beam condensing mirror 13A. The positions of the laser beam condensing mirror 13A and the high reflectance mirror 13B are adjusted by a laser beam manipulator 13C so that a laser focusing position in the chamber 10 coincides with a position specified by the control unit 20.

The traveling direction of the laser beam 301 emitted from the laser apparatus 30 is adjusted through the laser beam delivery optical system 50. The laser beam delivery optical system 50 includes a plurality of mirrors 51A and 51B for adjusting the traveling direction of the laser beam 301, and the position of at least one of the mirrors 51A and 51B is adjusted by an actuator (not illustrated).

The laser apparatus 30 includes a master oscillator as a light source configured to perform burst operation. The master oscillator emits the laser beam 301 in pulses in a burst-on duration. The master oscillator is, for example, a laser apparatus configured to emit a laser beam by exciting, through electrical discharging, gas as mixture of carbon dioxide gas with helium, nitrogen, or the like. Alternatively, the master oscillator may be a quantum cascade laser apparatus. The master oscillator emits the laser beam 301 in pulses by a Q switch scheme. The master oscillator may include a light switch, a polarizer, and the like. In the burst operation, the laser beam is emitted in continuous pulses at a predetermined repetition frequency in a burst-on duration, and the emission of the laser beam 301 is stopped in a burst-off duration.

The control unit 20 includes a computer including a central processing unit (CPU) and the like. The control unit 20 controls the entire EUV light generation apparatus 100 and also controls the laser apparatus 30 as described later. The control unit 20 receives, for example, a signal related to the pressure in the internal space of the chamber 10, which is measured by the pressure sensor 26, a signal related to image data of the droplet DL captured by the target sensor 27, and a burst signal from the exposure apparatus 200. The control unit 20 processes the image data and the like and controls the output timing of the droplet DL, the output direction of the droplet DL, and the like. Such various kinds of control are merely exemplary and may include other control as described later.

The following describes the configuration of the chamber 10 in more detail.

Figure 3:
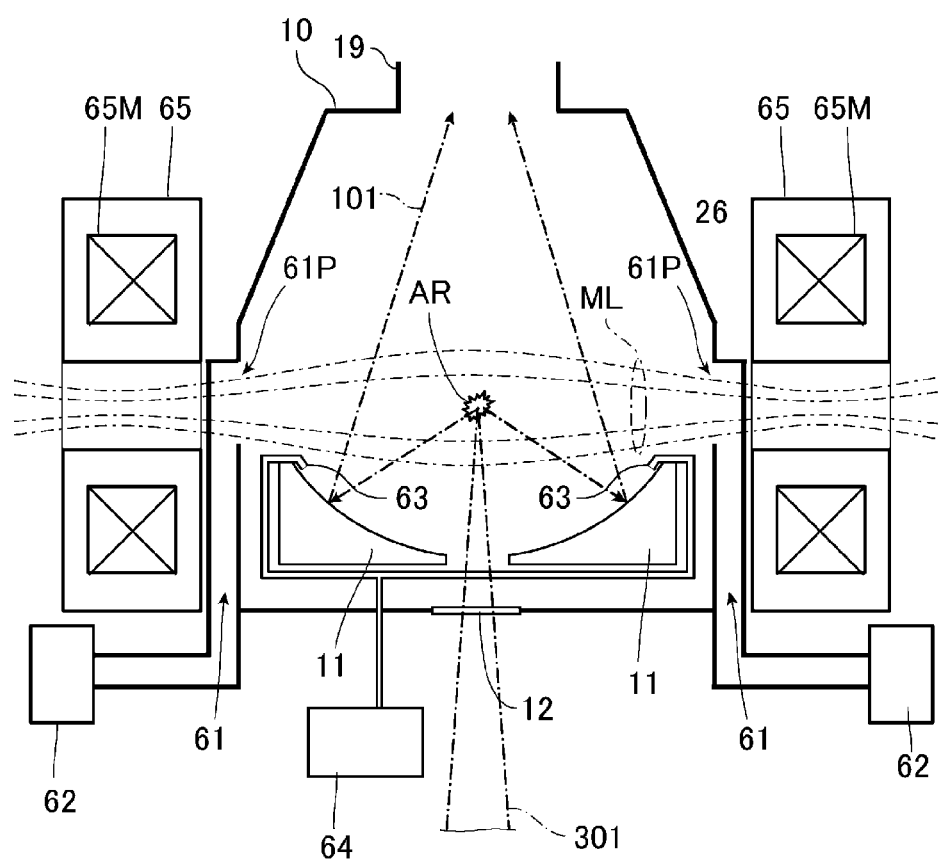
FIG. 3 is a pattern diagram illustrating a schematic configuration of a part including a chamber in an extreme ultraviolet light generation apparatus of a comparative example.

FIG. 3 is a pattern diagram illustrating a schematic configuration of a part including the chamber 10 in the extreme ultraviolet light generation apparatus of a comparative example. As illustrated in FIGS. 2 and 3, the chamber 10 includes a gas supply unit 63 configured to supply etching gas to the internal space of the chamber 10. The gas supply unit 63 is connected with an etching gas supply tank 64 through a pipe. When the target substance is tin, the etching gas is, for example, balance gas having a hydrogen gas concentration of 3% approximately. The balance gas may contain nitrogen ($N_2$) gas or argon (Ar) gas.

The gas supply unit 63 is adjusted so that the etching gas supplied into the chamber 10 flows near the reflective surface of the EUV light condensing mirror 11. Tin fine particles and tin ions are generated when plasma is generated from the target substance forming the droplet DL in the plasma generation region AR, and the tin fine particles and tin ions become stannane ($SnH_4$) gas at room temperature through reaction with hydrogen. A flow amount adjuster (not illustrated) is provided at the pipe between the gas supply unit 63 and the etching gas supply tank 64.

The chamber 10 also includes discharge units 61. Each discharge unit 61 discharges residual gas in the chamber 10. As illustrated in FIG. 2, discharge ports 61P of the discharge units 61 are formed at, for example, facing walls of the chamber 10. The residual gas contains fine particles and charged particles generated through the plasma generation from the target substance, product materials generated from those particles through reaction with the etching gas, and unreacted etching gas. Some of the charged particles are neutralized in the chamber 10, and the residual gas contains the neutralized charged particles. Each discharge unit 61 is connected with an exhaust device 62, and the residual gas discharged from the discharge unit 61 is subjected to predetermined discharge processing at the exhaust device 62.

The EUV light generation apparatus 100 according to the present embodiment also includes a magnetic field generation unit 65. The magnetic field generation unit 65 generates a magnetic field ML for converging the charged particles generated in the plasma generation region AR to the discharge ports 61P. When the discharge ports 61P of the discharge units 61 are formed at the facing walls of the chamber 10 as described above, the magnetic field generation unit 65 may be configured by, for example, a pair of electromagnets 65M disposed to sandwich the facing walls of the chamber 10 as illustrated in FIG. 3. The electromagnets 65M are disposed so that the plasma generation region AR is positioned at the middle of the electromagnets 65M. The direction of current supplied from a current supply unit to a superconductive coil of one of the electromagnets 65M is same as the direction of current supplied from a current supply unit to a superconductive coil of the other electromagnet 65M. When such current is supplied to the pair of superconductive coils, the magnetic field ML is generated at a magnetic flux density that is highest in the vicinity of each electromagnet 65M and decreases toward the plasma generation region AR. The magnetic field ML is also called a mirror magnetic field.

The magnetic field generation unit 65 may generate a magnetic field for converging the charged particles from a side of one of the electromagnets 65M to a side of the other electromagnet 65M through the plasma generation region AR. The magnetic field generation unit 65, which is configured by a pair of electromagnets 65M, may be configured by a pair of permanent magnets. The electromagnets 65M or permanent magnets for generating a magnetic field may be disposed inside the chamber 10.

Since the charged particles generated in the plasma generation region AR are converged to the discharge ports 61P by the magnetic field generated by the magnetic field generation unit 65 as described above, the discharge ports 61P is positioned on a magnetic field axis of the magnetic field ML in an example illustrated in FIG. 3. The discharge ports 61P may be positioned downstream of the EUV light condensing mirror 11 in flow of the etching gas supplied from the gas supply unit 63. However, the discharge ports 61P are preferably positioned on the magnetic field axis of the magnetic field ML to efficiently discharge the charged particles generated in the plasma generation region AR.

A trapping mechanism such as a heater configured to trap the fine particles may be provided to at least one of the pair of discharge units 61.

3.2 Operation of Extreme Ultraviolet Light Generation Apparatus of Comparative Example In the EUV light generation apparatus 100, an atmosphere in the chamber 10 is discharged, for example, at new installation or maintenance. In this process, purge and discharge may be repeated in the chamber 10 to discharged components in the atmosphere. Purge gas is preferably inert gas such as nitrogen ($N_2$) or argon (Ar). Thereafter, when the pressure in the chamber 10 becomes equal to or lower than a predetermined pressure, the control unit 20 starts introduction of the etching gas from the gas supply unit 63 into the chamber 10. In this case, the control unit 20 may control the flow amount adjuster (not illustrated) so that the pressure in the internal space of the chamber 10 is maintained at the predetermined pressure. Thereafter, the control unit 20 waits until a predetermined time elapses since the start of the etching gas introduction.

The control unit 20 drives the electromagnets 65M of the magnetic field generation unit 65 to generate the magnetic field ML. In addition, the control unit 20 discharges gas in the internal space of the chamber 10 from the discharge units 61 to the exhaust devices 62, and maintains the pressure in the internal space of the chamber 10 substantially constant based on the signal related to the pressure in the internal space of the chamber 10, which is measured by the pressure sensor 26. The pressure in the internal space of the chamber 10 in this case is, for example, in the range of 10 Pa to 80 Pa.

The control unit 20 performs current supply from the heater power source 45 to increase the temperature of the heater 44 so that the target substance in the tank 41 is heated to or maintained at a predetermined temperature equal to or higher than the melting point. In this case, the control unit 20 controls the temperature of the target substance to the predetermined temperature by adjusting the amount of current supplied from the heater power source 45 to the heater 44 based on an output from a temperature sensor (not illustrated). The predetermined temperature is, for example, in the range of 250° C. to 290° C. when the target substance is tin.

The control unit 20 controls the pressure in the tank 41 through the pressure adjuster 43 so that the target substance being melted is output through a nozzle hole of the nozzle 42 at a predetermined speed. The target substance discharged through the hole of the nozzle 42 may be in the form of jet.

The control unit 20 generates the droplet DL by applying voltage having a predetermined waveform to the piezoelectric element 46 through the piezoelectric power source 47. Vibration of the piezoelectric element 46 can propagate through the nozzle 42 to the jet of the target substance output from the nozzle hole. The jet of the target substance is divided in a predetermined period by the vibration, and accordingly, the droplet DL is generated from the target substance.

The control unit 20 outputs a light emission trigger to the laser apparatus 30. Having received the light emission trigger, the laser apparatus 30 emits the laser beam 301 in pulses. The emitted laser beam 301 is incident on the laser condensing optical system 13 through the laser beam delivery optical system 50 and the window 12.

The control unit 20 controls the laser beam manipulator 13C of the laser condensing optical system 13 so that the laser beam 301 condenses in the plasma generation region AR. In addition, the control unit 20 controls the laser apparatus 30 to emit the laser beam 301 based on a signal from the target sensor 27 so that the droplet DL is irradiated with the laser beam 301. Accordingly, the droplet DL is irradiated in the plasma generation region AR with the laser beam 301 converged by the laser beam condensing mirror 13A. Plasma generated through the irradiation radiates light including EUV light.

Among the light generated in the plasma generation region AR and including EUV light, the EUV light 101 is condensed to the intermediate focus point IF by the EUV light condensing mirror 11 and then incident on the exposure apparatus 200.

When plasma is generated from the target substance, charged particles are generated as described above. Each charged particle receives Lorentz force from the magnetic field ML and moves on a trajectory that rotates in a plane orthogonal to a magnetic field line. When the charged particle moving in this manner has a speed component in the direction toward one of the discharge ports 61P, the charged particle moves toward the wall of the chamber 10 while converging on a helical trajectory along the magnetic field line. Then, the charged particles are induced to each discharge port 61P provided at the wall of the chamber 10 near a convergence part of the magnetic field ML, and most of the charged particles flow into the discharge ports 61P. Thus, the charged particles exist at a higher density in a region in which the charged particles move while converging than that in the other space. As described above, some of the charged particles generated through the plasma generation from the target substance are neutralized. The charged particles having reached the inside of a discharge pipe from each discharge port 61P flow on discharge flow into the exhaust devices 62.

In addition, when plasma is generated from the target substance, fine particles that are electrically neutral are generated in addition to the charged particles. The fine particles are not affected by the magnetic field ML generated by the magnetic field generation unit 65 and thus diffuse in the chamber 10. Some of the fine particles diffusing in the chamber 10 adhere to the reflective surface of the EUV light condensing mirror 11. The fine particles adhering to the reflective surface become predetermined product materials through reaction with the etching gas supplied from the gas supply unit 63. The product materials are stannane when the target substance is tin as described above and the etching gas contains hydrogen. Stannane is gas at room temperature as described above. The product materials obtained through reaction with the etching gas move toward the discharge ports 61P on flow of unreacted etching gas. Further, at least part of charged particles not converged to the discharge ports 61P by the magnetic field ML and fine particles not adhering to the reflective surface of the EUV light condensing mirror 11 may react part of unreacted etching gas flowing through the chamber 10. Product materials obtained through the reaction move toward the discharge ports 61P on flow of unreacted etching gas. Furthermore, at least part of unreacted etching gas flows into the discharge ports 61P.

The unreacted etching gas, fine particles, charged particles, neutralized charged particles, product materials, and the like having flowed into the discharge ports 61P of the discharge units 61 flow as residual gas into the discharge units 61 and are provided with predetermined discharge treatment such as detoxification at the exhaust devices 62.

3.3 Problem

As described above, the fine particles, the charged particles, the neutralized charged particles, the product materials, and the like flow into the discharge units 61. These substances are mainly attributable to the target substance. In some cases, the substances attributable to the target substance accumulate in the discharge units 61. When the substances accumulate in the discharge units 61, a flow path through which the residual gas is discharged is narrowed, and the flow rate of the residual gas discharged from the discharge units 61 may decrease. Accordingly, the EUV light generation apparatus 100 needs maintenance. It has been desired to predict the timing of maintenance and the amount of EUV light that can be emitted until maintenance.

The following embodiments exemplarily describe an extreme ultraviolet light generation apparatus that can predict the timing of maintenance and the amount of EUV light that can be emitted until maintenance.

4. Embodiment 1

4.1 Configuration of Extreme Ultraviolet Light Generation Apparatus of Embodiment 1

The configuration of an extreme ultraviolet light generation apparatus of Embodiment 1 will be described below. Any component same as that described above is denoted by an identical reference sign, and duplicate description thereof is omitted unless specific description is needed.

Figure 4:
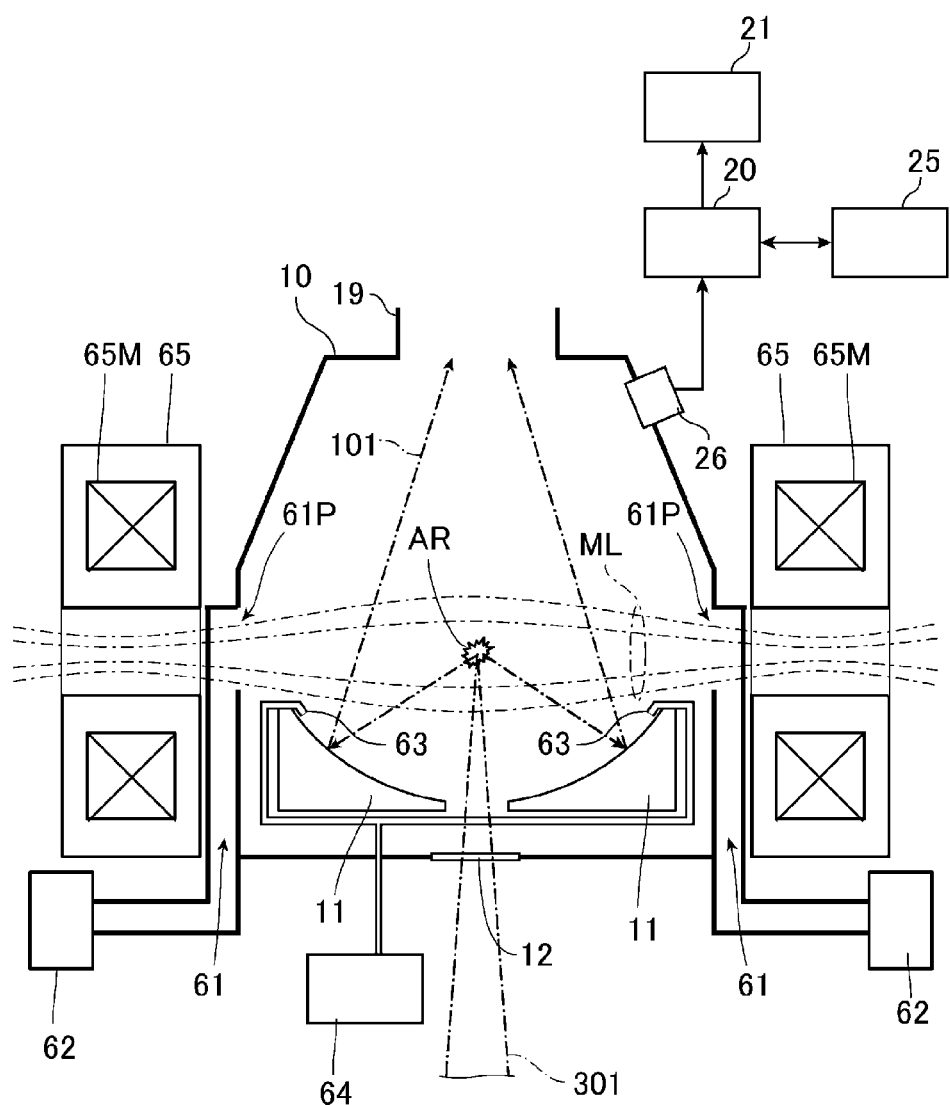
FIG. 4 is a pattern diagram illustrating a schematic configuration of a part including the chamber in an extreme ultraviolet light generation apparatus of Embodiment 1.

FIG. 4 is a pattern diagram illustrating a schematic configuration of a part including the chamber in the extreme ultraviolet light generation apparatus of Embodiment 1. As illustrated in FIG. 4, the EUV light generation apparatus 100 according to the present embodiment includes a memory 25 and an output unit 21, which is a difference from the EUV light generation apparatus 100 of the comparative example. The pressure sensor 26, which is illustrated in FIG. 2 but omitted in FIG. 3, is illustrated in FIG. 4.

The memory 25 is connected with the control unit 20. The memory 25 may be configured by, for example, a volatile memory unit and a non-volatile memory unit. The memory 25 may be an internal memory of the control unit 20.

The output unit 21 according to the present embodiment is configured by, for example, a display device. The display device is connected with the control unit 20 and performs display based on information output from the control unit 20. The output unit 21 is not limited to the display device. For example, the output unit 21 may be configured by an acoustic device and may output sound based on information output from the control unit 20. Alternatively, the output unit 21 may be configured by both the display device and the acoustic device or may be configured by another device.

4.2 Operation of Extreme Ultraviolet Light Generation Apparatus of Embodiment 1

Figure 5:
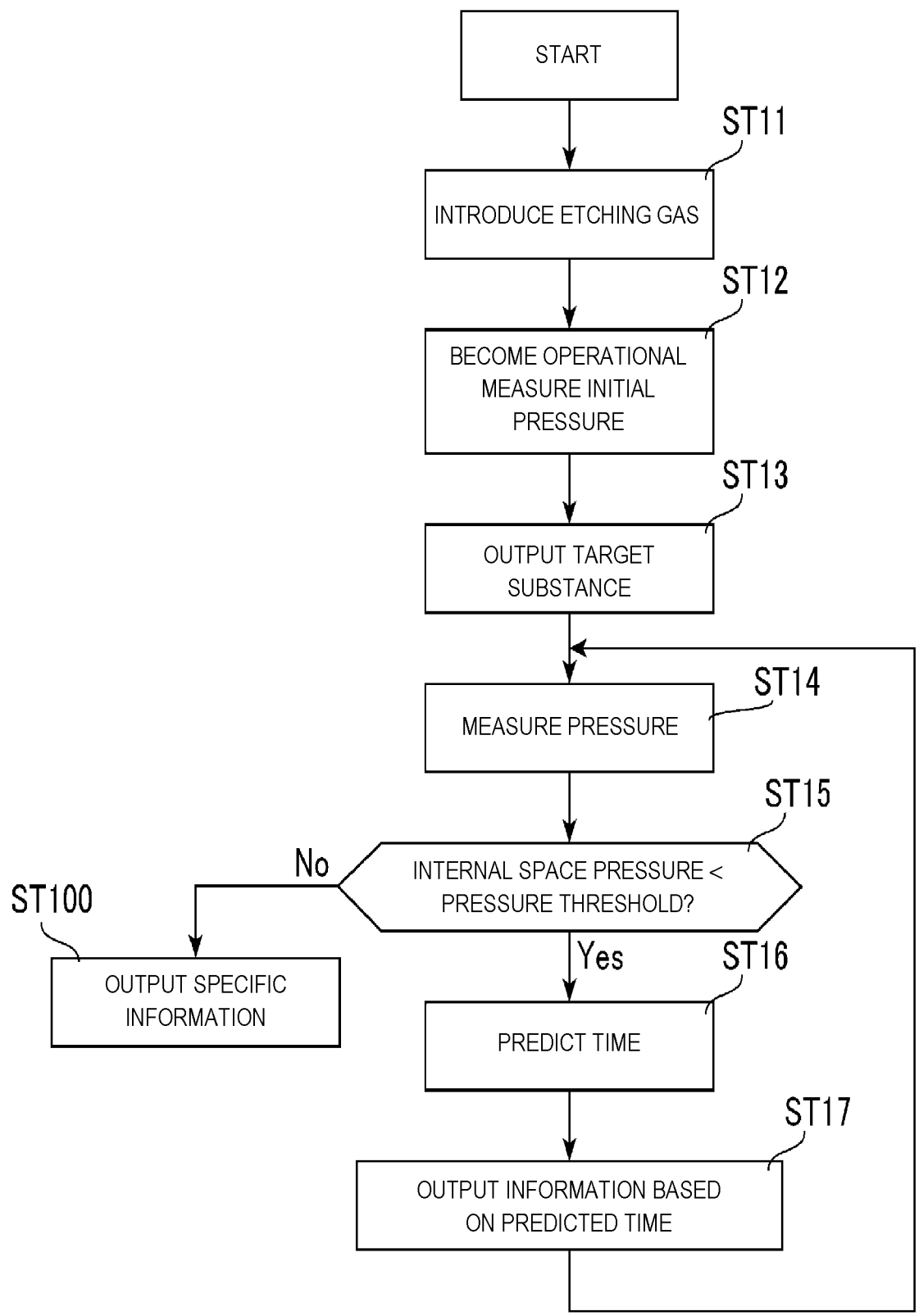
FIG. 5 is a flowchart schematically illustrating operation of the extreme ultraviolet light generation apparatus in Embodiment 1.

FIG. 5 is a flowchart schematically illustrating operation of the extreme ultraviolet light generation apparatus in Embodiment 1. Similarly to the comparative example, in the EUV light generation apparatus 100 according to the present embodiment, an atmosphere in the internal space of the chamber 10 is discharged, for example, at new installation or maintenance, and purge and discharge of inert gas are repeated as necessary to discharge components in the atmosphere. Thereafter, at step ST11, the control unit 20 starts introduction of the etching gas from the gas supply unit 63 into the internal space of the chamber 10. In this case, similarly to the comparative example, the control unit 20 may control the flow amount adjuster (not illustrated) provided at the pipe between the gas supply unit 63 and the etching gas supply tank 64.

Subsequently at step ST12, the control unit 20 discharges gas in the internal space of the chamber 10 through the discharge units 61 and maintains the pressure in the internal space of the chamber 10 substantially constant based on a signal related to the pressure in the internal space of the chamber 10, which is measured by the pressure sensor 26. Accordingly, the EUV light generation apparatus 100 becomes operational at step S12. When the EUV light generation apparatus 100 has become operational, the control unit 20 records the pressure in the internal space of the chamber 10, which is measured by the pressure sensor 26, in the memory 25. This pressure measurement is referred to as "measure initial pressure" in FIG. 5. Since this timing corresponds to the start of operation of the EUV light generation apparatus 100, the elapsed time since the start of operation of the EUV light generation apparatus 100 is zero, and the control unit 20 records the elapsed time in the memory 25. The pressure in the internal space of the chamber 10 at this timing is, for example, 60 Pa approximately.

When the EUV light generation apparatus 100 has become operational, the control unit 20 operates the target supply unit 40 to output the target substance from the target supply unit 40 at step ST13, and the output target substance becomes the droplet DL as described above. Thereafter, when having received a burst signal from the exposure apparatus 200, the control unit 20 controls the laser apparatus 30 to emit a laser beam based on the received burst signal. Accordingly, the EUV light 101 is emitted from the EUV light generation apparatus 100 as described above.

Subsequently at step ST14, the control unit 20 records the pressure in the internal space of the chamber 10, which is measured by the pressure sensor 26, in the memory 25. In addition, the control unit 20 records, in the memory 25, the elapsed time until the pressure measurement at step ST14 since the start of operation of the EUV light generation apparatus 100. The control unit 20 waits for a certain time between steps ST12 and ST14.

Subsequently at step ST15, the control unit 20 compares the pressure in the internal space of the chamber 10, which is measured at step ST14, with a threshold as a predetermined pressure recorded in the memory 25 in advance. The predetermined pressure is, for example, 80 Pa. The threshold is written as "pressure threshold" in diagrams described below in some cases. When the pressure in the internal space of the chamber 10 is lower than the threshold, the control unit 20 proceeds to step ST16. When the pressure in the internal space of the chamber 10 is equal to or higher than the threshold, the control unit 20 proceeds to step ST100.

At step ST100, the control unit 20 outputs a signal related to specific information to the output unit 21. When having received the signal, the output unit 21 performs predetermined output. The predetermined output is such that, for example, maintenance is needed. When the output unit 21 is a display device as described above, the output unit 21 performs the output by display. Alternatively, when the output unit 21 is an acoustic device as described above, the output unit 21 performs the output by sound. When the EUV light generation apparatus 100 includes the discharge units 61 as in the present embodiment, the pressure in the internal space of the chamber 10 becomes equal to or higher than the threshold due to accumulation of the target substance in the discharge units 61 in some cases. Thus, in the present embodiment, when outputting the signal related to specific information to the output unit 21 at step ST100, the control unit 20 outputs, to the output unit 21, a signal related to information indicating accumulation of substances attributable to the target substance in the discharge units 61. When having received the signal, the output unit 21 performs outputting that substances attributable to the target substance accumulate in the discharge units 61. When the output unit 21 is a display device as described above, the output unit 21 performs display that substances attributable to the target substance accumulate in the discharge units 61, or when the output unit 21 is an acoustic device, the output unit 21 outputs sound that substances attributable to the target substance accumulate in the discharge units 61.

Subsequently at step ST16, the control unit 20 predicts time until the internal space of the chamber 10 reaches the predetermined pressure by using the relation between the elapsed time since the start of operation of the EUV light generation apparatus 100 and the pressure measured after the start of operation of the EUV light generation apparatus 100 as described later.

Subsequently at step ST17, the control unit 20 outputs a signal related to information based on the predicted time to the output unit 21. When having received the signal, the output unit 21 performs outputting related to the information. When the information indicates the predicted time, the output unit 21 performs outputting related to the time, or when the information is obtained based on the predicted time and does not indicate the time, the output unit 21 performs outputting related to the information. The information not indicating the predicted time is, for example, the number of repetitions of extreme ultraviolet light operation, which is calculated by the control unit 20 based on the predicted time. When the output unit 21 is a display device as described above, the output unit 21 performs display related to the information, or when the output unit 21 is an acoustic device, the output unit 21 outputs sound related to the information.

Subsequently, the control unit 20 proceeds to step ST14 again. The control unit 20 may wait for a certain time between step ST14 and the next step ST14. In other words, the pressure in the chamber 10 may be measured at a certain period.

Figure 6:
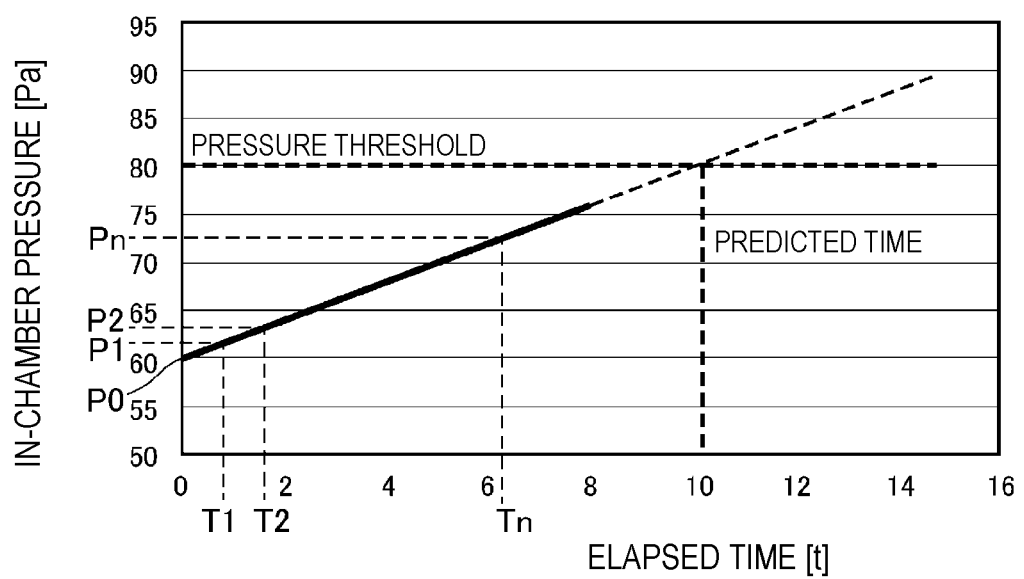
FIG. 6 is a schematic view illustrating a relation between the elapsed time and the pressure in an internal space of the chamber.

The following describes the prediction of the time until the internal space of the chamber 10 reaches the predetermined pressure at step ST16. FIG. 6 is a schematic view illustrating the relation between the elapsed time since the start of operation of the EUV light generation apparatus 100 and the pressure in the internal space of the chamber 10. In drawings described below, the pressure in the internal space of the chamber 10 is written as "in-chamber pressure" in some cases. In FIG. 6, the horizontal axis represents the elapsed time since the start of operation of the EUV light generation apparatus 100, and the vertical axis represents the measured pressure in the internal space of the chamber 10. In FIG. 6, the elapsed time 0 corresponds to the timing of the start of operation of the EUV light generation apparatus 100 at step ST12.

As described above, at steps ST12 and ST14, the control unit 20 records the elapsed time until measurement of the pressure in the internal space of the chamber 10 since the start of operation of the EUV light generation apparatus 100 and the pressure at each elapsed time in the memory 25. In the present embodiment, at the elapsed time 0 in FIG. 6, the pressure measurement at step ST12 is performed as described above and the control unit 20 records the elapsed time 0 and this measured pressure P0 in the memory 25. At the elapsed time T1 in FIG. 6, the pressure measurement at step ST14 of the first iteration is performed and the control unit 20 records the elapsed time T1 and a measured pressure P1 in the memory 25. Subsequently at step ST16 of the first iteration, the control unit 20 calculates the time until the internal space of the chamber 10 reaches the threshold as the predetermined pressure by using the relation between each of the pressure P0 and the pressure P1 obtained through the plurality of times of measurement and recorded and the corresponding one of the elapsed time 0 and the elapsed time T1. At step ST16 of the first iteration, since the elapsed time and the pressure are measured at two points, for example, the control unit 20 calculates the relation between the elapsed time and the pressure as a linear function passing through the two points and calculates the time until the internal space of the chamber 10 reaches the threshold as the predetermined pressure.

At the elapsed time T2 in FIG. 6, the pressure measurement at step ST14 of the second iteration is performed and the control unit 20 records the elapsed time T2 and a measured pressure P2. Subsequently at step ST16 of the second iteration, the control unit 20 calculates the time until the internal space of the chamber 10 reaches the threshold as the predetermined pressure by using the relation between each of the pressures P0 to P2 obtained through the plurality of times of measurement and the corresponding one of the elapsed times 0 to T2. Accordingly, at step ST16 of the n-th iteration after the second iteration as well, the relation between each of the pressures P0 to Pn and the corresponding one of the elapsed times 0 to Tn is calculated by using the pressures P0 to Pn recorded so far and the elapsed times 0 to Tn. Then, the time until the internal space of the chamber 10 reaches the threshold as the predetermined pressure is calculated by using the relation. The control unit 20 may calculate the relation by using, for example, a least-square method.

When the EUV light generation apparatus 100 includes the discharge units 61 as in the present embodiment, the pressure in the internal space of the chamber 10 increases due to accumulation of the target substance in the discharge units 61 as described above in some cases. Thus, in the EUV light generation apparatus 100 according to the present embodiment, the control unit 20 can predict a time until a predetermined amount of the target substance accumulates in the discharge units 61 by predicting the time until the internal space reaches the predetermined pressure. Substances attributable to the target substance accumulating in the discharge units 61 can be generated through generation of the EUV light 101 as described above. Thus, a duration in which extreme ultraviolet light is generated is preferably included in a duration until the pressure in the internal space of the chamber 10 is measured a plurality of times since the start of operation of the EUV light generation apparatus 100. In other words, when the duration since the start of operation of the EUV light generation apparatus 100 is referred to as a predetermined duration, the predetermined duration preferably includes the duration in which extreme ultraviolet light is generated.

4.3 Effect

In the present embodiment, the control unit 20 predicts the time until the internal space reaches the predetermined pressure by using the relation between the elapsed time since the start of the predetermined duration including the duration in which extreme ultraviolet light is generated and the pressure measured in the predetermined duration. Thus, an operator using the EUV light generation apparatus 100 can know, by using the predicted time, an approximate duration until a predetermined amount of the target substance accumulates in the discharge units 61 and the EUV light generation apparatus 100 needs maintenance.

Further, in the present embodiment, the output unit 21 outputs the predicted time. Thus, the operator using the EUV light generation apparatus 100 can easily know the predicted time.

Furthermore, in the present embodiment, the control unit 20 outputs specific information to the output unit 21 when the measured pressure is higher than the predetermined pressure. In this case, the operator can know unexpected accumulation of a predetermined amount of the target substance in the discharge units 61 or increase of the pressure in the internal space of the chamber 10 due to another cause.

Moreover, in the present embodiment, when outputting specific information to the output unit 21, the control unit 20 outputs, to the output unit 21, information indicating accumulation of substances attributable to the target substance in the discharge units 61. In this case, when the EUV light generation apparatus 100 includes the discharge units 61 as described above, the target substance accumulates in the discharge units 61 in some cases, and when not knowing the accumulation, the operator can know the cause of pressure increase.

In the present embodiment, the predetermined duration is the duration since the start of operation of the EUV light generation apparatus 100 at step ST12, and the time until the internal space reaches the predetermined pressure is predicted. However, for example, the start of the predetermined duration may be the timing of the first emission of the EUV light 101.

5. Embodiment 2

5.1 Configuration of Extreme Ultraviolet Light Generation Apparatus of Embodiment 2

The configuration of an extreme ultraviolet light generation apparatus of Embodiment 2 will be described below. Any component same as that described above is denoted by an identical reference sign, and duplicate description thereof is omitted unless specific description is needed.

Figure 7:
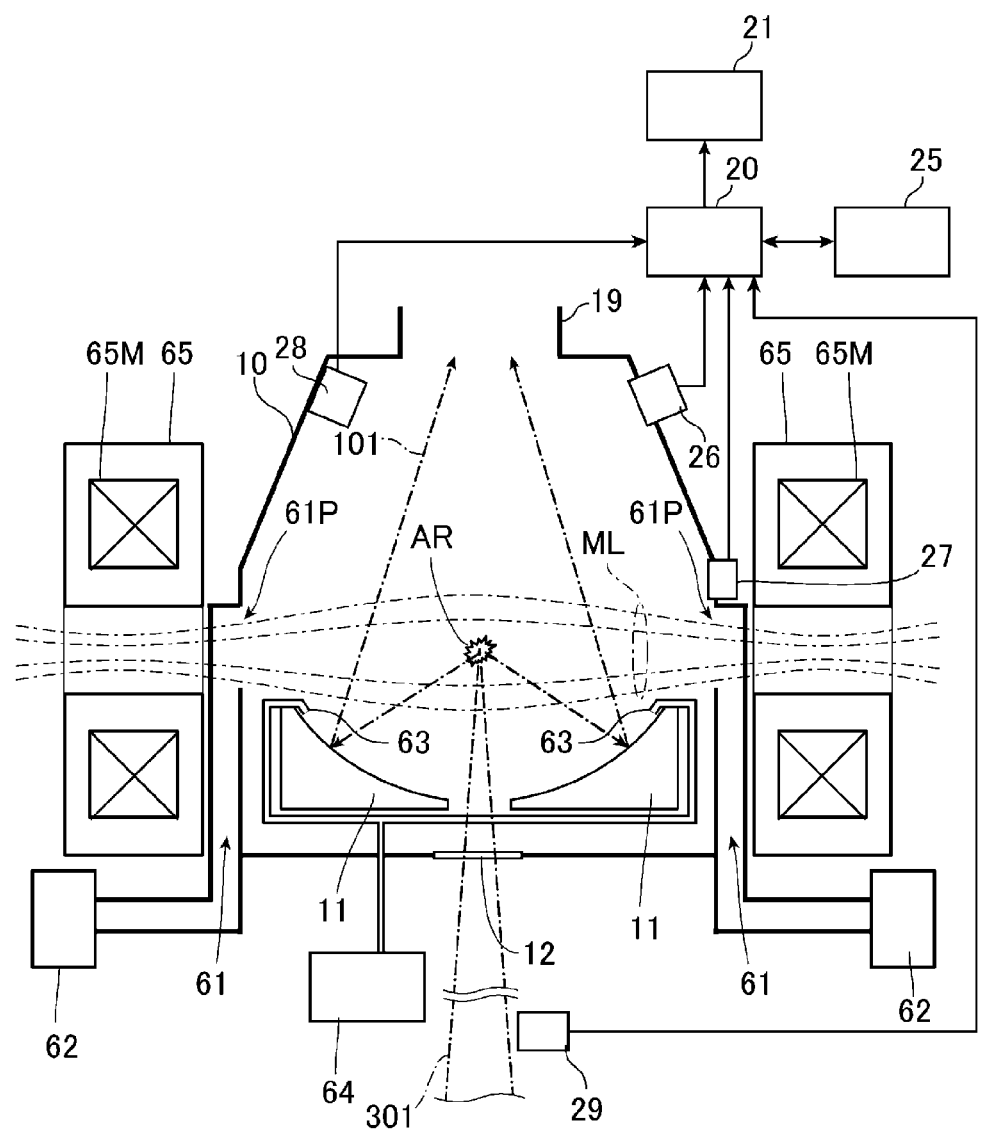
FIG. 7 is a pattern diagram illustrating a schematic configuration of a part including the chamber in an extreme ultraviolet light generation apparatus of Embodiment 2.

FIG. 7 is a pattern diagram illustrating a schematic configuration of a part including the chamber in the extreme ultraviolet light generation apparatus of Embodiment 2. The EUV light generation apparatus 100 according to the present embodiment includes an EUV light detection unit 28 and a laser beam detection unit 29, which is a difference from the EUV light generation apparatus 100 of Embodiment 1. The target sensor 27, which is illustrated in FIG. 2 but omitted in FIG. 4, is illustrated in FIG. 7.

In the present embodiment, the EUV light detection unit 28 is provided in the internal space of the chamber 10. The EUV light detection unit 28 is configured by an optical element configured to detect the EUV light 101 and is connected with the control unit 20. When having detected the EUV light 101, the EUV light detection unit 28 outputs a signal indicating the detection of the EUV light 101 to the control unit 20. The EUV light detection unit 28 may be provided at a place different from that in FIG. 7 as long as the EUV light detection unit 28 can detect the EUV light 101.

The laser beam detection unit 29 is provided at a position outside the chamber 10 where the laser beam detection unit 29 can detect the laser beam 301. Such a position is, for example, in the laser beam delivery optical system 50, between the laser apparatus 30 and the laser beam delivery optical system 50, or between the laser beam delivery optical system 50 and the window 12. The laser beam detection unit 29 is configured by an optical element configured to detect the laser beam 301 incident in the internal space of the chamber 10 through the window 12 and is connected with the control unit 20. When having detected the laser beam 301, the laser beam detection unit 29 outputs a signal indicating the detection of the laser beam 301 to the control unit 20. The laser beam detection unit 29 may be provided at a place different from the above-described position as long as the laser beam detection unit 29 can detect the laser beam 301.

5.2 Operation of Extreme Ultraviolet Light Generation Apparatus of Embodiment 2

Figure 8:
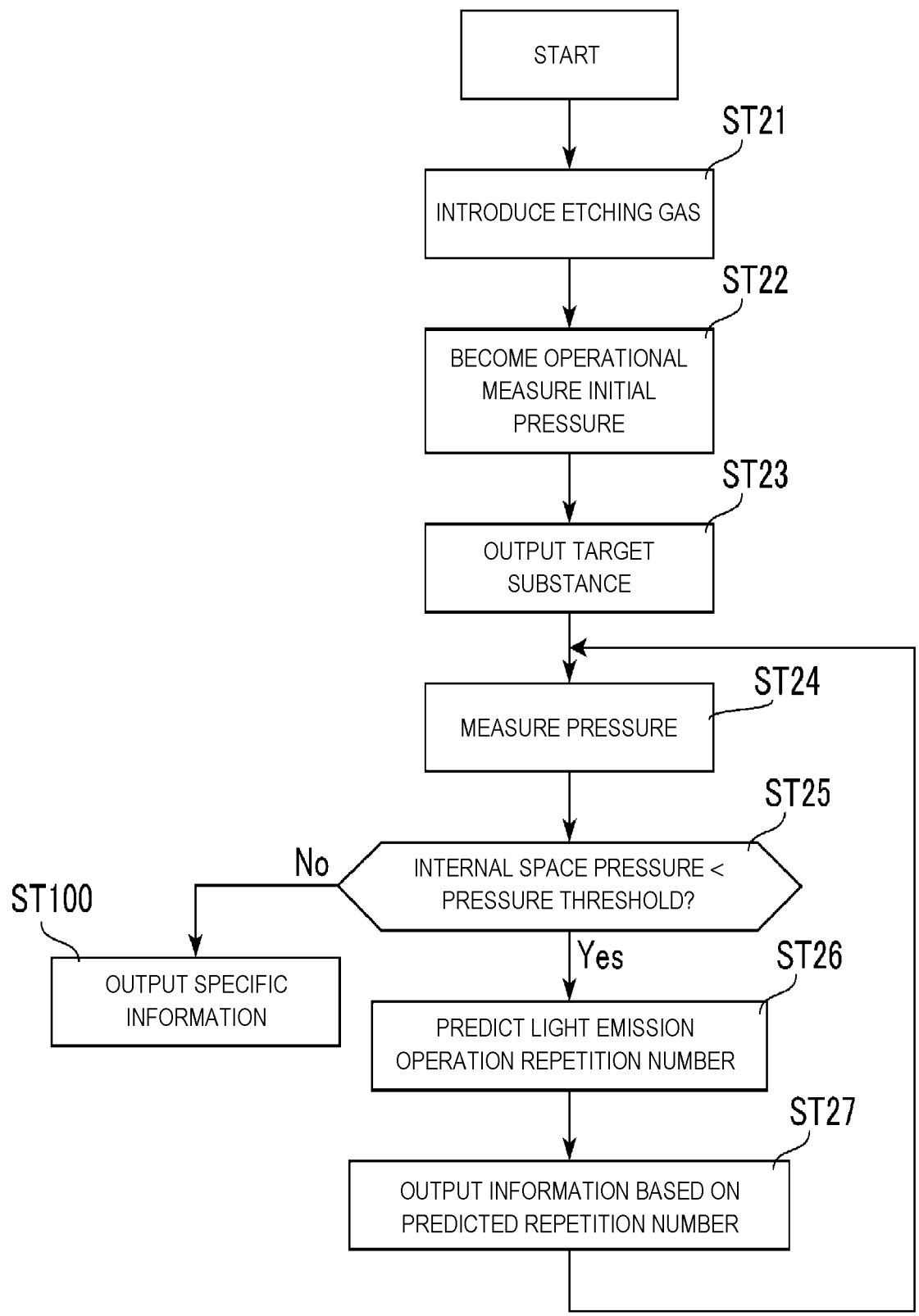
FIG. 8 is a flowchart schematically illustrating operation of the extreme ultraviolet light generation apparatus in Embodiment 2.

FIG. 8 is a flowchart schematically illustrating operation of the extreme ultraviolet light generation apparatus in Embodiment 2. At steps ST21 and ST22, the EUV light generation apparatus 100 according to the present embodiment performs operations same as those at steps ST11 and ST12 of Embodiment 1. In the present embodiment, when the EUV light generation apparatus 100 becomes operational, the control unit 20 records the pressure in the internal space of the chamber 10, which is measured by the pressure sensor 26, in the memory 25. Since this timing corresponds to the start of operation of the EUV light generation apparatus 100, the number of repetitions of light emission operation of the EUV light 101 by the EUV light generation apparatus 100 is zero, and the control unit 20 records the number of repetitions in the memory 25.

When the EUV light generation apparatus 100 has become operational, the control unit 20 operates the target supply unit 40 to output the target substance from the target supply unit 40 at step ST23, and the output target substance becomes the droplet DL as described above. Thereafter, when having received a burst signal from the exposure apparatus 200, the control unit 20 controls the laser apparatus 30 to emit a laser beam based on the received burst signal. Accordingly, the EUV light generation apparatus 100 emits the EUV light 101 as described above.

In the present embodiment, when having detected light emission operation of the EUV light 101 at step ST24 after the EUV light generation apparatus 100 becomes operational, the control unit 20 records the pressure in the internal space of the chamber 10, which is measured by the pressure sensor 26, in the memory 25. In this case, the control unit 20 also records the number of repetitions of light emission operation of the EUV light 101, which is measured until the pressure is measured at step ST24 since the start of operation of the EUV light generation apparatus 100, in the memory 25. When the duration since the start of operation of the EUV light generation apparatus 100 is referred to as a predetermined duration, the control unit 20 records the number of repetitions of light emission operation of the EUV light 101 since the start of the predetermined duration and the pressure in the internal space of the chamber 10, which is measured in the predetermined duration, in the memory 25.

The control unit 20 may record, as the number of repetitions of light emission operation of the EUV light 101, the number of repetitions of light emission of EUV light detected by the EUV light detection unit 28. In this case, the laser beam detection unit 29 may not be provided. Alternatively, the control unit 20 may record, as the number of repetitions of light emission operation of the EUV light 101, the number of repetitions of light emission of the laser beam 301 detected by the laser beam detection unit 29. In this case, the EUV light detection unit 28 may not be provided.

Alternatively, the control unit 20 may record, as the number of repetitions of light emission operation of the EUV light 101, the number of emission signals input to the light source in the laser apparatus 30. Each signal input to the light source is a trigger for emission of one pulse of the laser beam from the laser apparatus 30 in the burst operation. In this case, the EUV light detection unit 28 and the laser beam detection unit 29 may not be provided.

Subsequently at step ST25, the control unit 20 compares the pressure in the internal space of the chamber 10, which is measured at step ST24, with a threshold as a predetermined pressure recorded in the memory 25 in advance. Then, similarly to step ST15 of Embodiment 1, the control unit 20 proceeds to step ST26 or ST100.

At step ST100 of the present embodiment, the control unit 20 performs processing same as that at step ST100 of Embodiment 1.

At step ST26, the control unit 20 uses the relation between the number of repetitions of light emission operation of extreme ultraviolet light since the start of operation of the EUV light generation apparatus 100 and the pressure measured since the start of operation of the EUV light generation apparatus 100. The control unit 20 predicts, by using the relation, the number of repetitions of light emission operation of EUV light until the internal space of the chamber 10 reaches the predetermined pressure as described later.

Subsequently at step ST27, the control unit 20 outputs a signal related to information based on the predicted number of repetitions to the output unit 21. When the information indicates the predicted number of repetitions, the control unit 20 outputs a signal related to the number of repetitions. When the information is obtained based on the predicted number of repetitions and does not indicate the number of repetitions, the control unit 20 outputs a signal related to the information. The information not indicating the predicted number of repetitions is, for example, the time until the internal space of the chamber 10 reaches the predetermined pressure, which is predicted by the control unit 20 based on the predicted number of repetitions. When having received the signal, the output unit 21 outputs the information based on the predicted number of repetitions by a method same as that in Embodiment 1.

Subsequently, the control unit 20 proceeds to step ST24 again. The control unit 20 may proceed from step ST24 to the next step ST24 after a constant number of repetitions of light emission operation of the EUV light 101 is detected. Thus, the pressure in the internal space of the chamber 10 may be measured each time the constant number of repetitions of light emission operation are performed.

Figure 9:
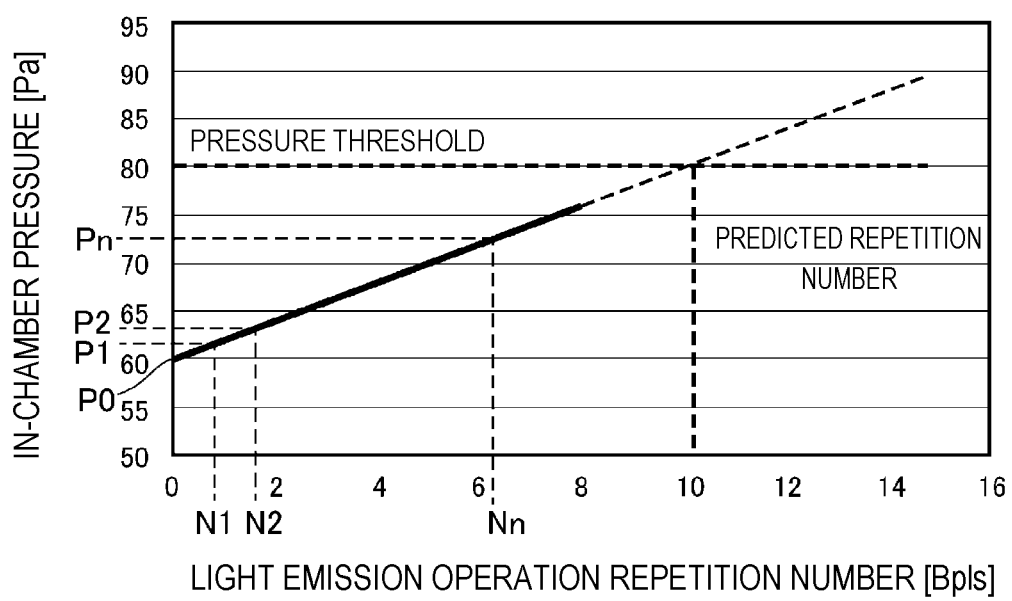
FIG. 9 is a schematic view illustrating a relation between the number of repetitions of light emission operation of extreme ultraviolet light and the pressure in the internal space of the chamber.

The following describes the prediction of the number of repetitions of light emission operation of EUV light until the internal space of the chamber 10 reaches the predetermined pressure at step ST26 in the present embodiment. FIG. 9 is a schematic view illustrating the relation between the number of repetitions of light emission operation of extreme ultraviolet light and the pressure in the internal space of the chamber. In FIG. 9, the horizontal axis represents the number of repetitions of light emission operation of the EUV light 101, and the vertical axis represents the measured pressure in the internal space of the chamber 10.

As described above, at steps ST22 and ST24, the control unit 20 records the number of repetitions of light emission operation of the EUV light 101 until the pressure in the internal space of the chamber 10 is measured since the start of operation of the EUV light generation apparatus 100 and the pressure in the memory 25. In the present embodiment, the pressure measurement is performed at step ST22 and the control unit 20 records the number of repetitions of light emission operation so far and a measured pressure P0. Since no light emission operation of EUV light is performed at step ST22, the number of repetitions of light emission operation is zero as described above. In addition, the pressure measurement at step ST26 of the first iteration is performed, and a light emission operation repetition number N1 so far and a measured pressure P1 are recorded. Subsequently at step ST26 of the first iteration, the control unit 20 calculates the number of repetitions of light emission operation until the internal space of the chamber 10 reaches the threshold as the predetermined pressure by using the relation between each of the pressures P0 and P1 obtained through the plurality of times of measurement and the corresponding one of light emission operation repetition numbers 0 and N1. At step ST26 of the first iteration, since the number of repetitions of light emission operation and the pressure are measured at two points, for example, the control unit 20 calculates the relation between the number of repetitions of light emission operation and the pressure as a linear function passing through the two points. Then, the control unit 20 calculates, by using the relation, the number of repetitions of light emission operation until the internal space of the chamber 10 reaches the threshold as the predetermined pressure.

At step ST26 of the second iteration, the pressure measurement is performed and the control unit 20 records a light emission operation repetition number N2 so far and the measured pressure P2 in the memory 25. Subsequently at step ST26 of the second iteration, the control unit 20 calculates the number of repetitions of light emission operation until the internal space of the chamber 10 reaches the threshold as the predetermined pressure by using the relation between each of the pressures P0 to P2 obtained through the plurality of times of measurement and the corresponding one of the light emission operation repetition numbers 0 to N2. Accordingly, at step ST26 of the n-th iteration after the second iteration as well, the relation between each of the pressures P0 to Pn and the corresponding one of the light emission operation repetition numbers 0 to Nn recorded so far is calculated. Then, the control unit 20 calculates the number of repetitions of light emission operation until the internal space of the chamber 10 reaches the threshold as the predetermined pressure by using the relation. The control unit 20 may calculate the relation by using, for example, the least-square method.

The control unit 20 may calculate, as information based on the number of repetitions of light emission operation predicted as described above, for example, the time until the internal space of the chamber 10 reaches the predetermined pressure. In this case, a time until the number of repetitions of light emission operation becomes equal to the predicted number of repetitions is predicted from the elapsed time until the pressure Pn is measured at step ST26 of the n-th iteration since the start of operation of the EUV light generation apparatus 100.

5.3 Effect

In the present embodiment, the control unit 20 predicts the number of repetitions of light emission operation of extreme ultraviolet light until the internal space reaches the predetermined pressure by using the relation between the number of repetitions of light emission operation of extreme ultraviolet light since the start of the predetermined duration including the duration in which extreme ultraviolet light is generated and the pressure measured in the predetermined duration. Thus, the operator using the EUV light generation apparatus 100 can know, by using the predicted number of repetitions, an approximate number of repetitions of light emission operation until a predetermined amount of the target substance accumulates in the discharge units 61 and the EUV light generation apparatus 100 needs maintenance.

Further, in the present embodiment, the information based on the predicted number of repetitions is output to the output unit 21. Thus, the operator using the EUV light generation apparatus 100 can easily know the predicted number of repetitions.

Furthermore, in the present embodiment as well, similarly to Embodiment 1, the control unit 20 outputs specific information to the output unit 21 when the measured pressure is higher than the predetermined pressure. Thus, similarly to Embodiment 1, the operator can know unexpected accumulation of a predetermined amount of the target substance in the discharge units 61 or increase of the pressure in the internal space of the chamber 10 due to another cause.

Moreover, in the present embodiment, similarly to Embodiment 1, when outputting specific information to the output unit 21, the control unit 20 outputs, to the output unit 21, information indicating accumulation of substances attributable to the target substance in the discharge units 61. Thus, similarly to Embodiment 1, when the EUV light generation apparatus 100 includes the discharge units 61 as described above, the target substance accumulates in the discharge units 61 in some cases, and when not knowing the accumulation, the operator can know the cause of pressure increase.

6. Embodiment 3

6.1 Operation of Extreme Ultraviolet Light Generation Apparatus of Embodiment 3

The configuration of an extreme ultraviolet light generation apparatus of Embodiment 3 will be described below. Any component same as that described above is denoted by an identical reference sign, and duplicate description thereof is omitted unless specific description is needed. The configuration of the extreme ultraviolet light generation apparatus of the present embodiment is same as the configuration of the extreme ultraviolet light generation apparatus of Embodiment 1, and thus description thereof is omitted.

Figure 10:
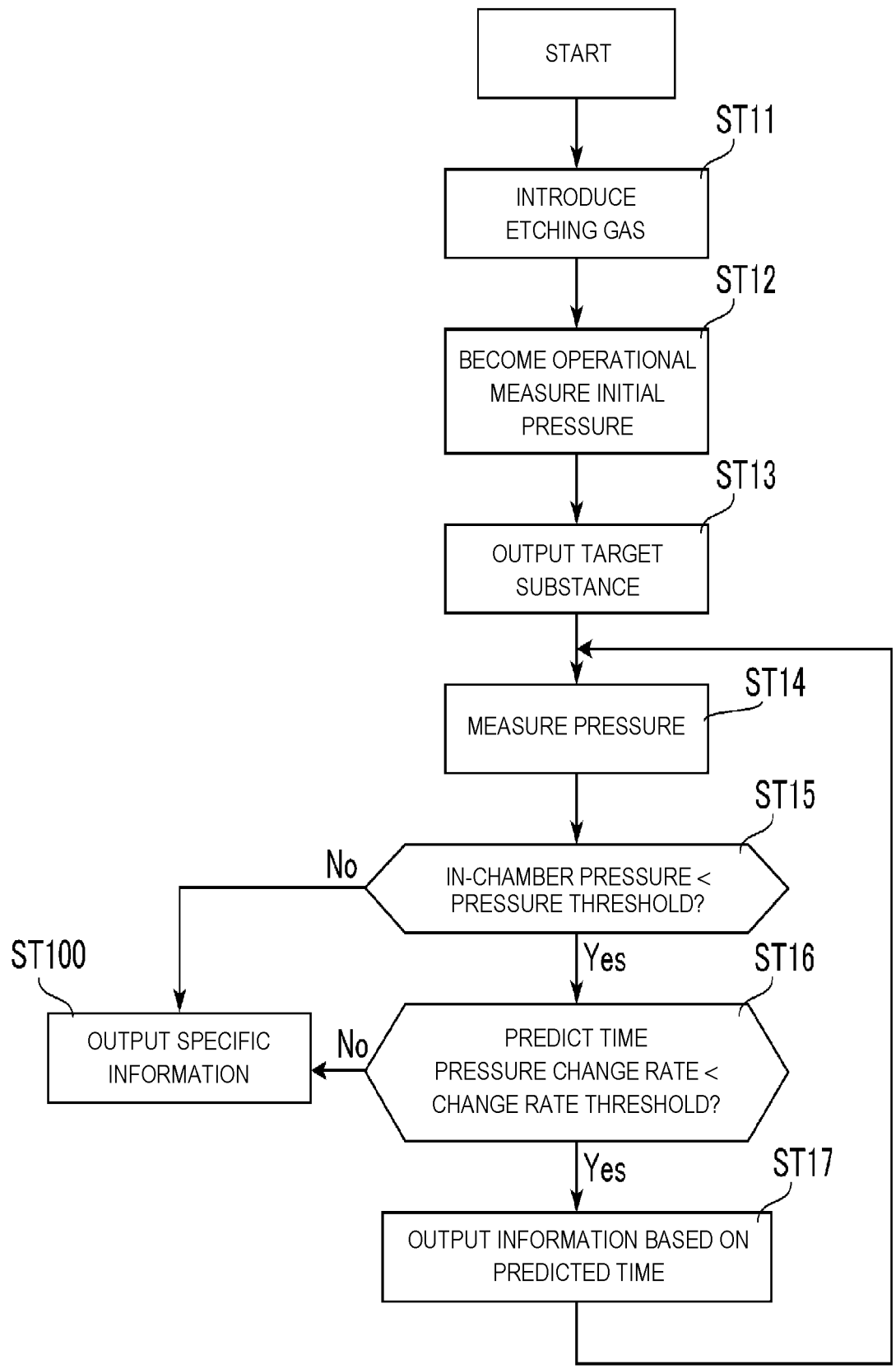
FIG. 10 is a flowchart schematically illustrating operation of the extreme ultraviolet light generation apparatus in Embodiment 3.

FIG. 10 is a flowchart schematically illustrating operation of the extreme ultraviolet light generation apparatus in Embodiment 3. The EUV light generation apparatus 100 according to the present embodiment is different from the EUV light generation apparatus 100 of Embodiment 1 in that the control unit 20 compares the change rate of the pressure for a predetermined time with a threshold as a predetermined change rate at step ST16. At step ST16 of the present embodiment as well, similarly to Embodiment 1, the control unit 20 predicts the time until the internal space of the chamber 10 reaches the predetermined pressure, but the control unit 20 may not perform the prediction when a certain condition is satisfied as described later. At step ST16 of the present embodiment, the control unit 20 may perform the comparison as follows, for example.

Figure 11:
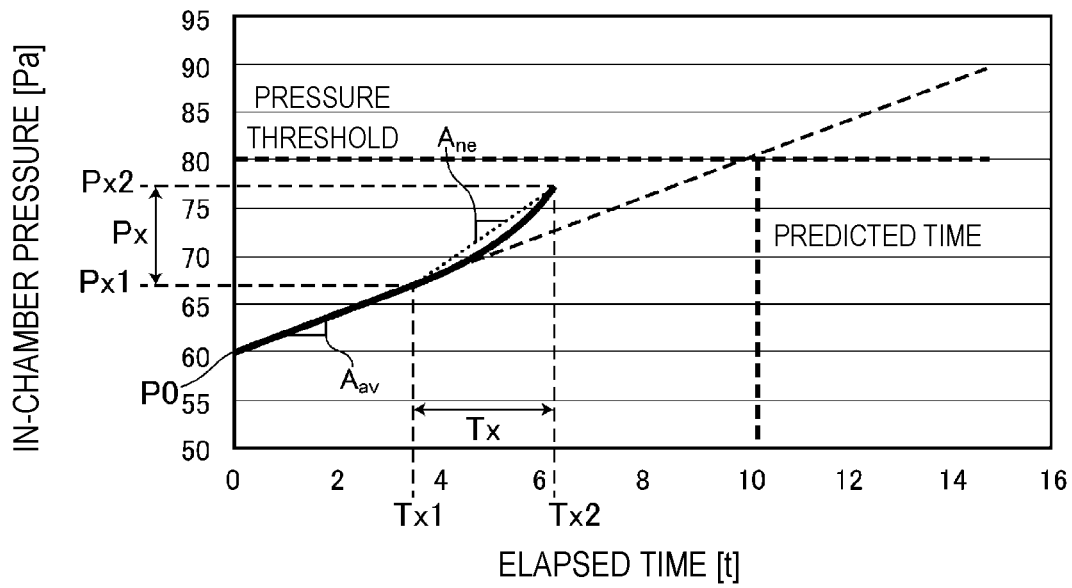
FIG. 11 is a schematic view illustrating an exemplary relation between the elapsed time and the pressure in the internal space of the chamber.

A first example of the comparison will be described first. FIG. 11 is a schematic view illustrating an exemplary relation between the elapsed time and the pressure in the internal space of the chamber. In FIG. 11, Tx2 denotes the elapsed time when the pressure is measured at the latest step ST14 before the comparison is performed at step ST16, and Px2 denotes the corresponding pressure. Tx1 denotes the elapsed time a predetermined time before the elapsed time Tx2, and Px1 denotes the corresponding pressure. Tx denotes the predetermined time, and Px denotes change of the pressure for the predetermined time Tx. The pressure Px is obtained by subtracting the pressure Px1 from the pressure Px2. The elapsed time 0 and the pressure P0 have meanings same as those in FIG. 6. In the present example, at the elapsed time Tx1, the control unit 20 calculates an average change rate $A_{av}$ of the pressure until the elapsed time Tx1 since the pressure P0 is measured at the elapsed time 0, and records the average change rate $A_{av}$ in the memory 25. In addition, the control unit 20 calculates the change rate $A_{ne}$ of the pressure for the predetermined time Tx from the elapsed time Tx1 to the elapsed time Tx2, and records the change rate $A_{ne}$ in the memory 25. Then, the control unit 20 compares the average change rate $A_{av}$ and the change rate $A_{ne}$. When the comparison indicates that, for example, the change rate $A_{ne}$ exceeds a predetermined multiple of the average change rate $A_{av}$, the control unit 20 proceeds to step ST100. The predetermined multiple is, for example, 1.1. Thus, in the present example, the predetermined change rate is 1.1 times higher than the average change rate $A_{av}$ until the predetermined time before the latest pressure measurement since the EUV light generation apparatus 100 has become operational.

Figure 12:
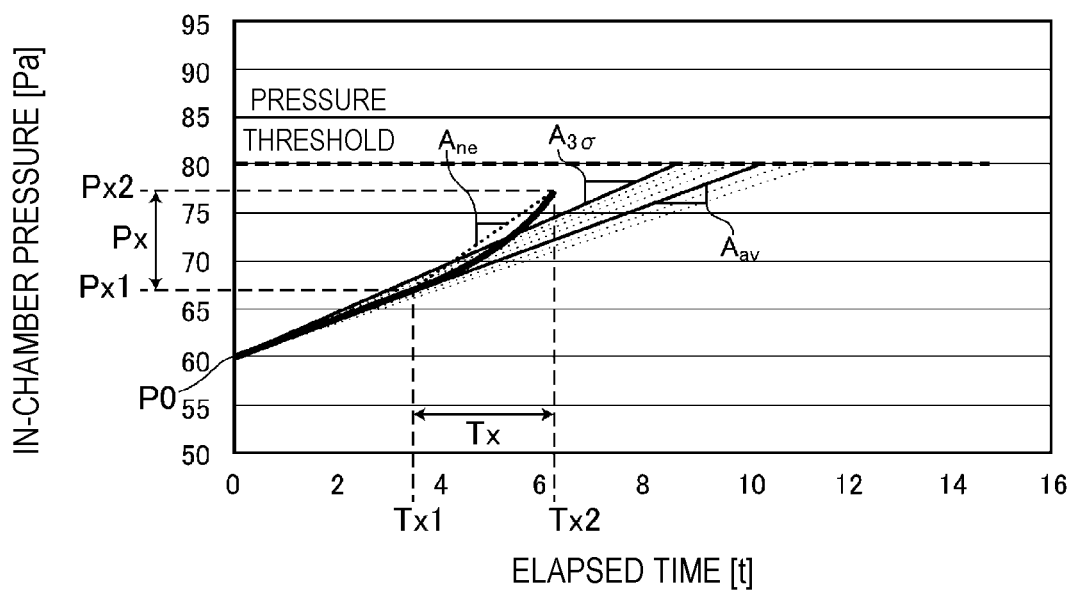
FIG. 12 is a schematic view illustrating another exemplary relation between the elapsed time and the pressure in the internal space of the chamber.

Alternatively, the control unit 20 may perform the predetermined comparison as follows, for example. FIG. 12 is a diagram illustrating another exemplary relation between the elapsed time and the pressure in the internal space of the chamber. In FIG. 12, the elapsed times 0, Tx1, Tx2, the predetermined time Tx, the pressures P0, Px1, Px2, and the pressure Px have meanings same as those in FIG. 11. In the present example, the memory 25 records a plurality of change rates of the pressure in the internal space for the elapsed time until the internal space of the chamber 10 reaches the predetermined pressure since the EUV light generation apparatus 100 has become operational. The change rates are recorded in the memory 25 based on the past record. In FIG. 12, the change rates are illustrated with dotted lines. In the present example, at step ST16, the control unit 20 calculates, as the average change rate $A_{av}$, the average of the change rates stored in the memory 25. FIG. 12 illustrates the average change rate $A_{av}$ calculated in this manner. In addition, at step ST16, the control unit 20 calculates a change rate $A_{3\sigma}$ that is the sum of the average change rate $A_{av}$ and triple of the standard deviation of the change rates recorded in the memory 25. FIG. 12 illustrates the change rate $A_{3\sigma}$ calculated in this manner. In addition, similarly to the above-described example, the control unit 20 calculates the pressure change rate $A_{ne}$ for the predetermined time Tx from the elapsed time Tx1 to the elapsed time Tx2 and records the change rate $A_{ne}$ in the memory 25. FIG. 12 illustrates the change rate $A_{ne}$ calculated in this manner. Then, at step ST16, the control unit 20 compares the change rate $A_{3\sigma}$ and the change rate $A_{ne}$. When the comparison indicates that the pressure change rate $A_{ne}$ for the latest predetermined time Tx exceeds the change rate $A_{3\sigma}$, the control unit 20 proceeds to step ST100. Thus, in the present example, the predetermined change rate is the change rate $A_{3\sigma}$. In the present example, the change rate $A_{3\sigma}$ is calculated by the control unit 20 at step ST16, but may be recorded in the memory 25 in advance.

When the pressure change rate for the predetermined time is lower than the predetermined change rate at step ST16, the control unit 20 proceeds to step ST17. When the pressure change rate for the predetermined time is higher than the predetermined change rate at step ST16, unexpected anomaly other than accumulation of substances attributable to the target substance in the discharge units has potentially occurred. The unexpected anomaly is, for example, air inflow due to degradation of sealing of the chamber. Thus, when the pressure change rate for the predetermined time Tx is higher than the predetermined change rate, the control unit 20 proceeds to step ST100 as described above and outputs information indicating the occurrence of unexpected anomaly in this case. The control unit 20 may not predict the time until the internal space of the chamber 10 reaches the predetermined pressure when the pressure change rate for the predetermined time is higher than the predetermined change rate at step ST16.

6.2 Effect

In the present embodiment, when the pressure change rate $A_{ne}$ for the predetermined time Tx exceeds the predetermined change rate at step ST16, the control unit 20 proceeds to step ST100 and outputs specific information to the output unit 21. Thus, the operator can know the occurrence of unexpected anomaly in the chamber.

7. Embodiment 4

7.1 Operation of extreme ultraviolet light generation apparatus of Embodiment 4

The configuration of an extreme ultraviolet light generation apparatus of Embodiment 4 will be described below. Any component same as that described above is denoted by an identical reference sign, and duplicate description thereof is omitted unless specific description is needed. The configuration of the extreme ultraviolet light generation apparatus of the present embodiment is same as the configuration of the extreme ultraviolet light generation apparatus of Embodiment 2, and thus description thereof is omitted.

Figure 13:
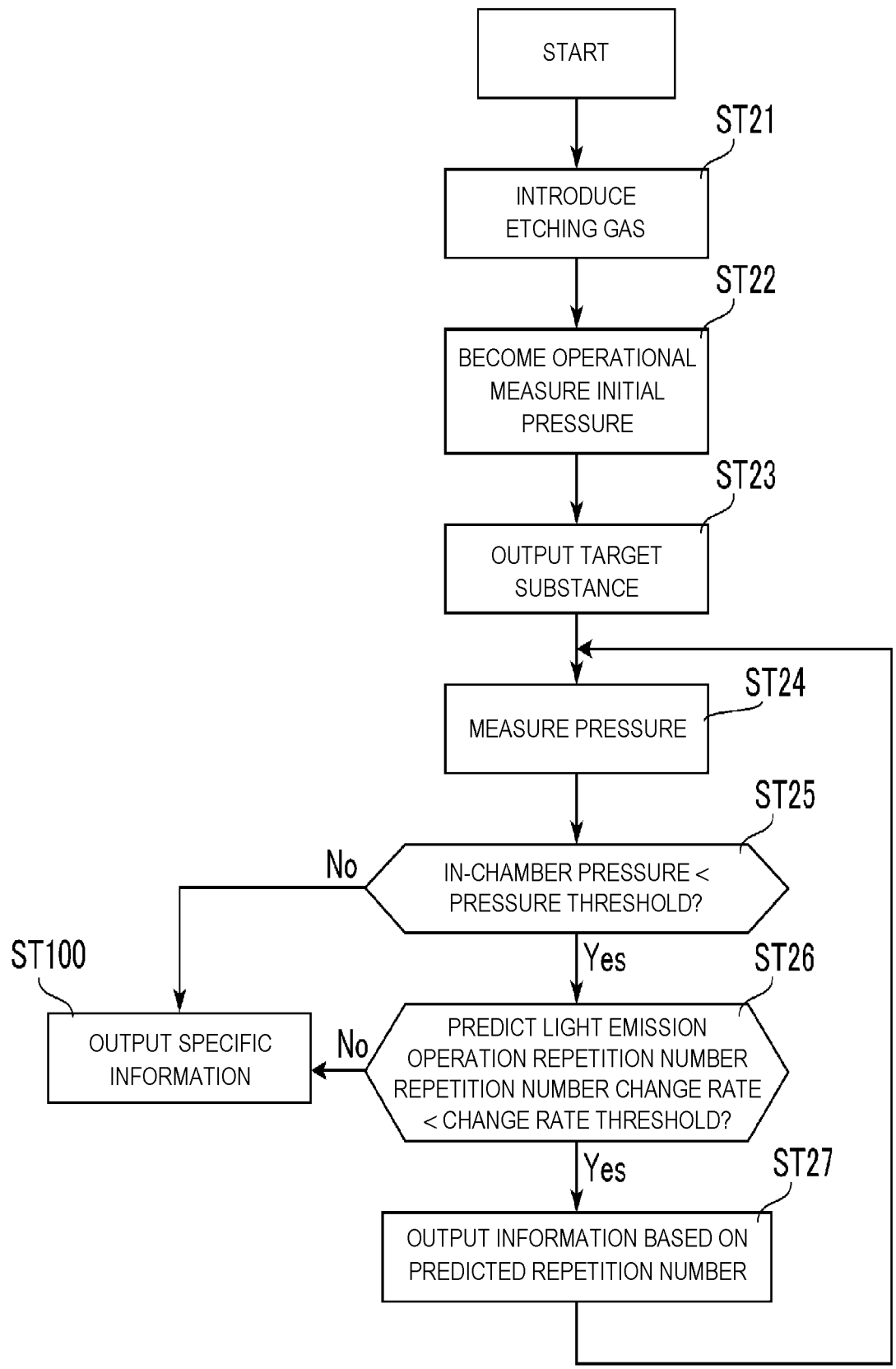
FIG. 13 is a flowchart schematically illustrating operation of the extreme ultraviolet light generation apparatus in Embodiment 4.

FIG. 13 is a flowchart schematically illustrating operation of the extreme ultraviolet light generation apparatus in Embodiment 4. The EUV light generation apparatus 100 according to the present embodiment is different from the EUV light generation apparatus 100 of Embodiment 2 in that the control unit 20 compares a pressure change rate for a predetermined increase value of the light emission operation repetition number of EUV light with a threshold as a predetermined change rate at step ST26. At step ST26 of the present embodiment as well, similarly to Embodiment 2, the control unit 20 predicts the number of repetitions of light emission operation until the internal space of the chamber 10 reaches the predetermined pressure, but the control unit 20 may not perform the prediction when a certain condition is satisfied as described later. At step ST26 of the present embodiment, the control unit 20 may perform the comparison as follows, for example.

Figure 14:
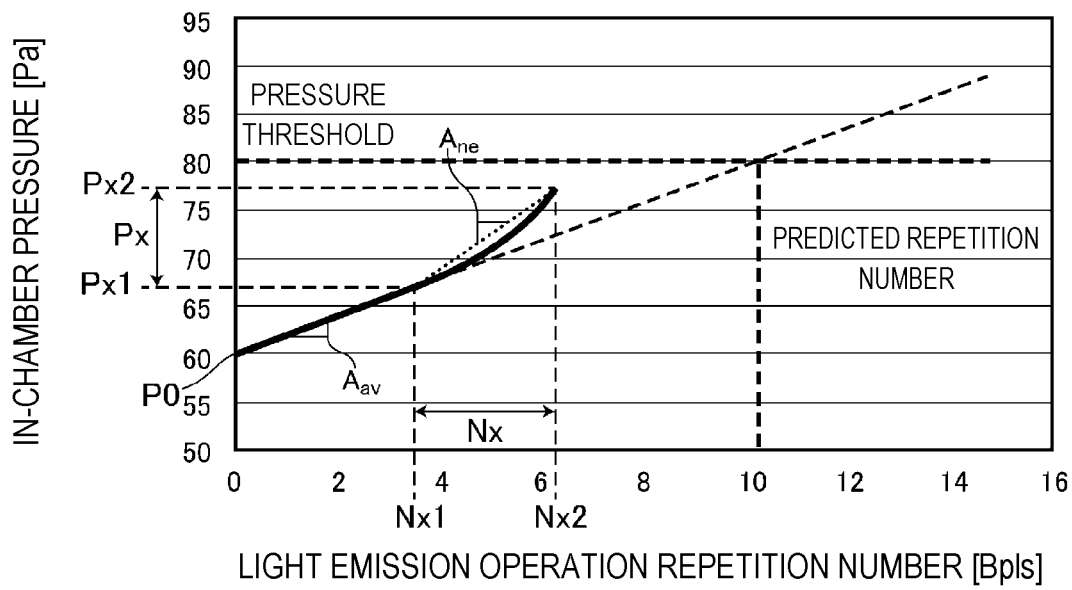
FIG. 14 is a schematic view illustrating an exemplary relation between the number of repetitions of light emission operation of EUV light and the pressure in the internal space of the chamber.

A first example of the comparison will be described first. FIG. 14 is a schematic view illustrating an exemplary relation between the number of repetitions of light emission operation of EUV light and the pressure in the internal space of the chamber. In FIG. 14, Nx2 denotes the number of repetitions of light emission operation of EUV light until the pressure measurement at the latest step ST24 before the comparison is performed at step ST26, and Px2 denotes the corresponding pressure. Nx1 denotes the light emission operation repetition number a predetermined repetition number before the light emission operation repetition number Nx2, and Px1 denotes the corresponding pressure. Nx denotes the predetermined repetition number, and Px denotes change of the pressure while the predetermined number Nx of repetitions of light emission operation is performed. The pressure Px is obtained by subtracting the pressure P1 from the pressure P2, and the predetermined repetition number Nx is obtained by subtracting the repetition number Nx1 from the repetition number Nx2. The light emission operation repetition number 0 and the pressure P0 have meanings same as those in FIG. 9. In the present example, the control unit 20 calculates the pressure average change rate $A_{av}$ until the number of repetitions of light emission operation becomes equal to Nx1 since the pressure P0 is measured when the number of repetitions of light emission operation is zero at step ST22, and records the pressure average change rate $A_{av}$ in the memory 25. In addition, the control unit 20 calculates the pressure change rate $A_{ne}$ until the number of repetitions of light emission operation becomes equal to Nx2 since the number of repetitions of light emission operation has become equal to Nx1, in other words, while Nx repetitions of light emission operation are performed, and records the pressure change rate $A_{ne}$ in the memory 25. Then, the control unit 20 compares the average change rate $A_{av}$ and the change rate $A_{ne}$. When the comparison indicates that, for example, the change rate $A_{ne}$ exceeds a predetermined multiple of the average change rate $A_{av}$, the control unit 20 proceeds to step ST100. Similarly to Embodiment 3, the predetermined multiple is, for example, 1.1. Thus, in the present example, the predetermined change rate is 1.1 times higher than the average change rate $A_{av}$ until the number of repetitions of light emission operation reaches the light emission operation repetition number Nx before the latest pressure measurement since the EUV light generation apparatus 100 has become operational.

Figure 15:
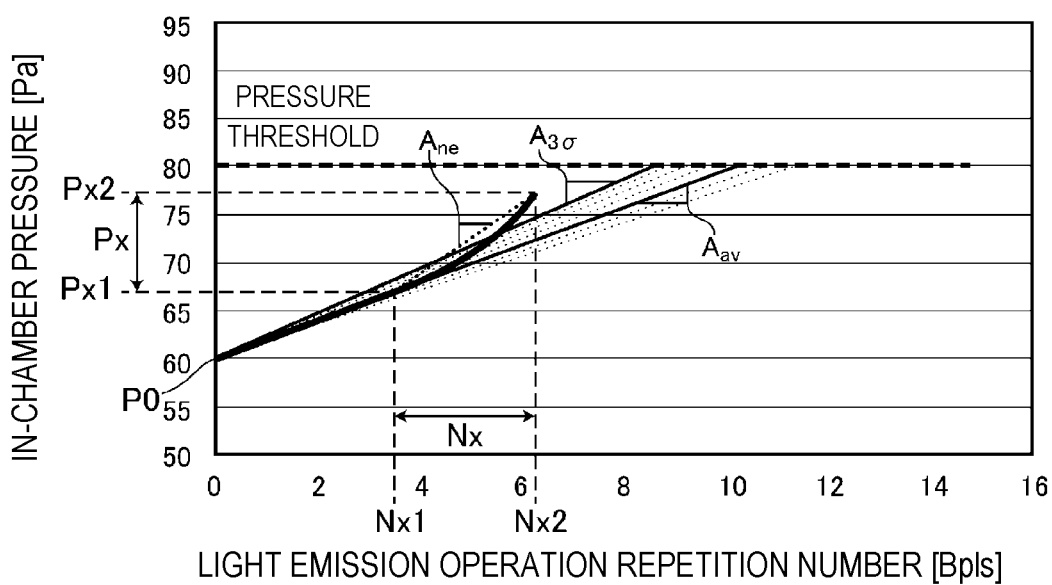
FIG. 15 is a schematic view illustrating another exemplary relation between the number of repetitions of light emission operation of EUV light and the pressure in the internal space of the chamber.

Alternatively, the control unit 20 may perform the predetermined comparison as follows, for example. FIG. 15 is a schematic view illustrating another exemplary relation between the number of repetitions of light emission operation of EUV light and the pressure in the internal space of the chamber. In FIG. 15, the EUV light emission operation repetition numbers N0, Nx1, and Nx2, the predetermined repetition number Nx, the pressures P0, Px1, and Px2, and the pressure Px have meanings same as those in FIG. 14. In the present example, the memory 25 records a plurality of change rates of the pressure in the internal space for the number of repetitions of light emission operation of EUV light until the internal space of the chamber 10 reaches the predetermined pressure since the EUV light generation apparatus 100 has become operational. The change rates are recorded in the memory 25 based on the past record. In FIG. 15, the change rates are illustrated with dotted lines. In the present example, at step ST26, the control unit 20 calculates, as the average change rate $A_{av}$, the average of the change rates stored in the memory 25. FIG. 15 illustrates the average change rate $A_{av}$ calculated in this manner. In addition, the control unit 20 calculates the change rate $A_{3\sigma}$ that is the sum of the average change rate $A_{av}$ and triple of the standard deviation of the change rates recorded in the memory 25. FIG. 15 illustrates the change rate $A_{3\sigma}$ calculated in this manner. In addition, similarly to the above-described exemplary, the control unit 20 calculates the pressure change rate $A_{ne}$ for the predetermined repetition number Nx from the light emission operation repetition number Nx1 to the light emission operation repetition number Nx2, and records the pressure change rate $A_{ne}$ in the memory 25. FIG. 15 illustrates the change rate $A_{ne}$ calculated in this manner. Then, the control unit 20 compares the change rate $A_{3\sigma}$ and the change rate $A_{ne}$. When the comparison indicates that, for example, the pressure change rate $A_{ne}$ for the latest EUV light emission operation repetition number Nx exceeds the change rate $A_{3\sigma}$, the control unit 20 proceeds to step ST100. Thus, in the present example, the predetermined change rate is the change rate $A_{3\sigma}$. In the present example, the change rate $A_{3\sigma}$ is calculated by the control unit 20 at step ST26, but may be recorded in the memory 25 in advance.

At step ST26, when the pressure change rate $A_{ne}$ for the predetermined EUV light emission operation repetition number Nx is lower than the predetermined change rate, the control unit 20 proceeds to step ST27. When the pressure change rate $A_{ne}$ for the predetermined EUV light emission operation repetition number Nx is higher than the predetermined change rate at step ST26, unexpected anomaly other than accumulation of substances attributable to the target substance in the discharge units has potentially occurred. The unexpected anomaly is, for example, air inflow due to degradation of sealing of the chamber. Thus, when the pressure change rate for the predetermined repetition number Nx is higher than the predetermined change rate, the control unit 20 proceeds to step ST100 as described above and outputs information indicating the occurrence of unexpected anomaly in this case. The control unit 20 may not predict the number of repetitions of light emission operation until the internal space of the chamber 10 reaches the predetermined pressure when the pressure change rate for the predetermined repetition number Nx is higher than the predetermined change rate at step ST26.

7.2 Effect

In the present embodiment, when the pressure change rate $A_{ne}$ for the predetermined EUV light emission operation repetition number Nx exceeds the predetermined change rate, the control unit 20 proceeds to step ST100 and outputs specific information to the output unit 21. Thus, the operator can know abrupt increase of the pressure in the internal space of the chamber 10.

8. Embodiment 5

8.1 Operation of Extreme Ultraviolet Light Generation Apparatus of Embodiment 5

The configuration of an extreme ultraviolet light generation apparatus of Embodiment 5 will be described below. Any component same as that described above is denoted by an identical reference sign, and duplicate description thereof is omitted unless specific description is needed. The configuration of the extreme ultraviolet light generation apparatus of the present embodiment is same as the configuration of the extreme ultraviolet light generation apparatus of Embodiment 1, and thus description thereof is omitted.

Figure 16:
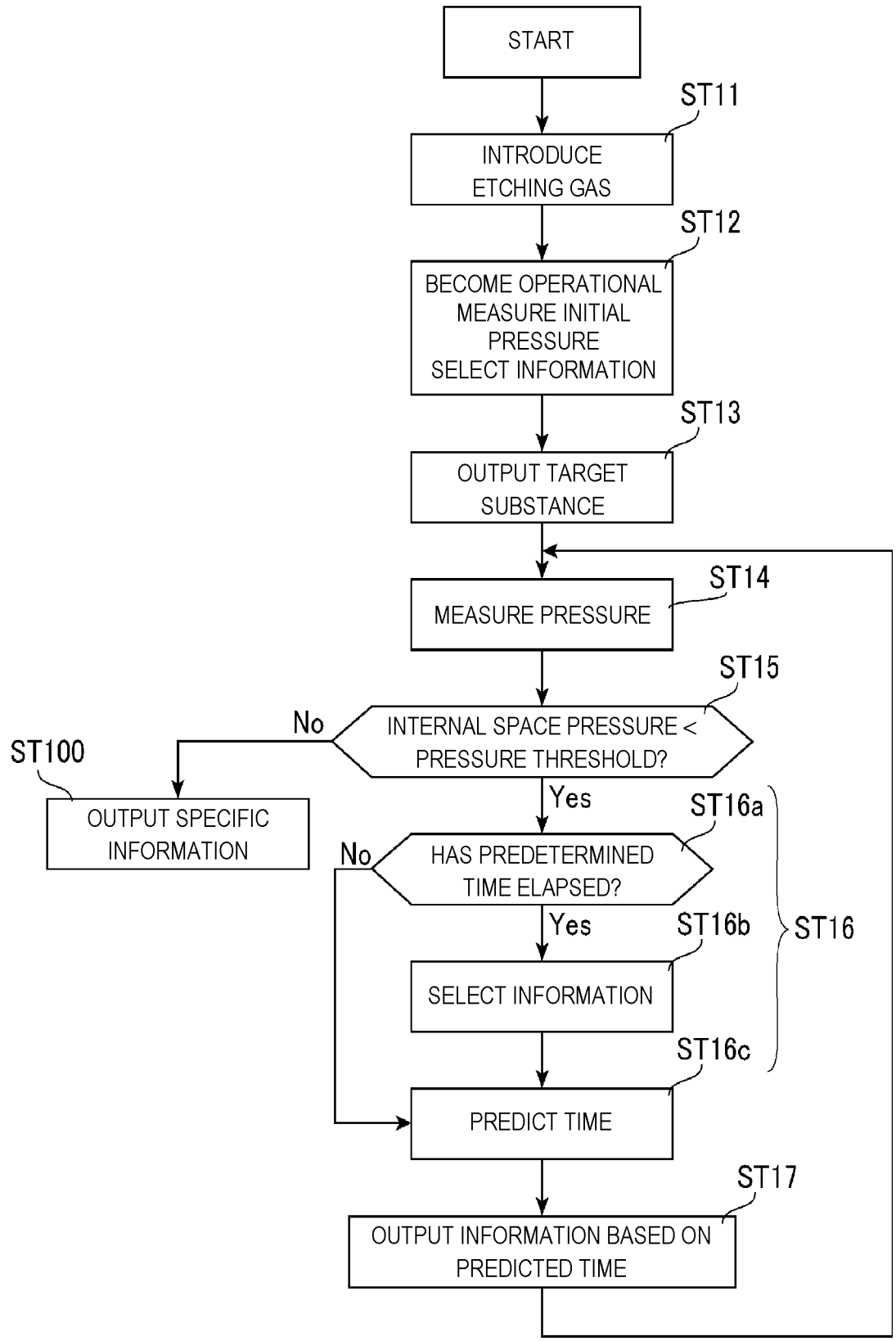
FIG. 16 is a flowchart schematically illustrating operation of the extreme ultraviolet light generation apparatus in Embodiment 5.

FIG. 16 is a flowchart schematically illustrating operation of the extreme ultraviolet light generation apparatus in Embodiment 5. In the EUV light generation apparatus 100 according to the present embodiment, step ST16 includes steps ST16a to ST16c, which is a main difference from the EUV light generation apparatus 100 of Embodiment 1.

Figure 17:
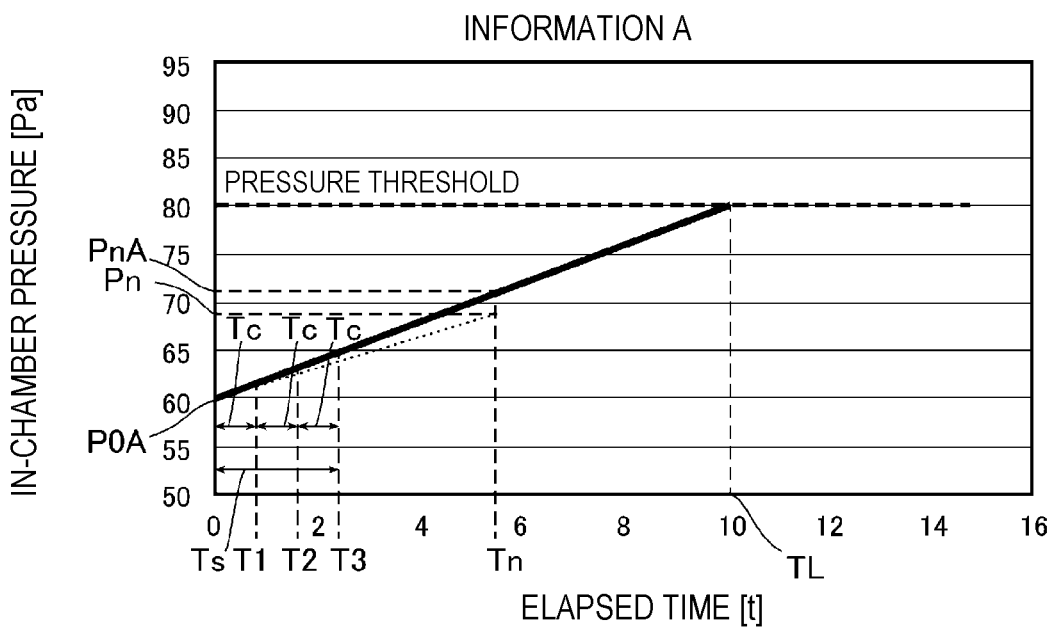
FIG. 17 is a schematic diagram obtained by visualizing exemplary information recorded in a memory.
Figure 18:
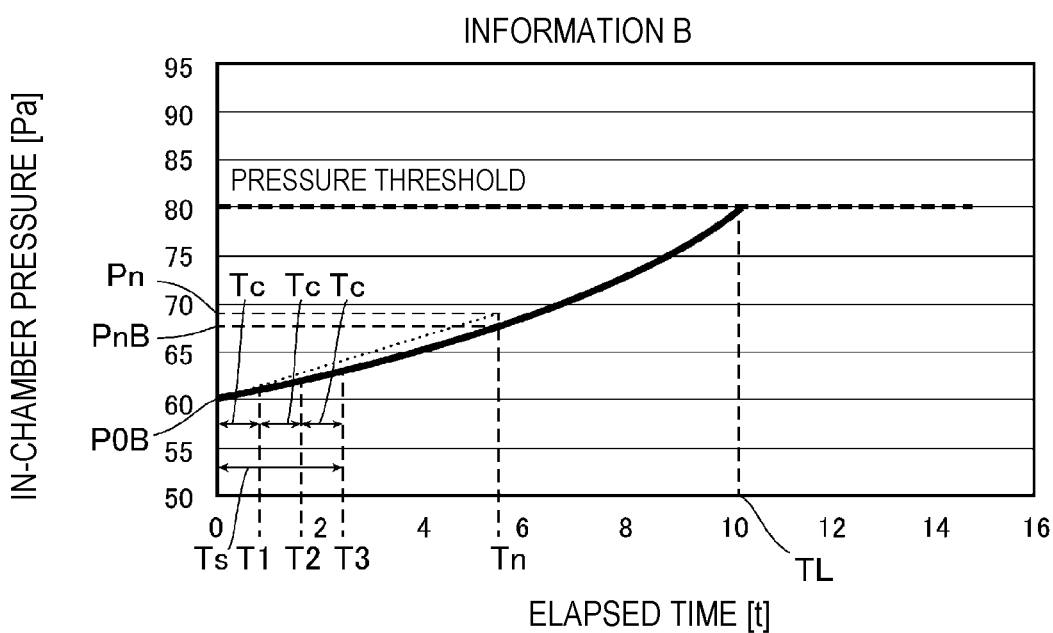
FIG. 18 is a schematic diagram obtained by visualizing other exemplary information recorded in the memory.

The memory 25 according to the present embodiment records a plurality of pieces of information including the relation between the elapsed time and the pressure. FIG. 17 is a schematic diagram obtained by visualizing exemplary information recorded in the memory 25. In FIG. 17, the relation between the elapsed time and the pressure, which is recorded in the memory 25, is indicated as a linear function. In other words, such a function or a matrix table of the elapsed time and the pressure, which indicates the function, is recorded in the memory 25 as the information. This information is referred to as information A. FIG. 18 is a schematic diagram obtained by visualizing other exemplary information recorded in the memory 25. In FIG. 18, the relation between the elapsed time and the pressure, which is recorded in the memory 25, is indicated as a curved function. In other words, such a function or a matrix table of the elapsed time and the pressure, which indicates the function, is recorded in the memory 25 as the information. This information is referred to as information B. The memory 25 according to the present embodiment records, for example, the information A illustrated in FIG. 17, the information B illustrated in FIG. 18, and information of another relation between the elapsed time and the pressure. In this manner, the memory 25 according to the present embodiment records the pieces of information including the relation between the elapsed time and the pressure as described above.

In the present embodiment, at step ST12, the control unit 20 selects specific information based on the pressure P0 measured at the elapsed time 0 illustrated in FIG. 6 after the EUV light generation apparatus 100 has become operational. In this case, the control unit 20 may select information including the pressure P0 associated with the elapsed time 0 that is closest to the measured pressure P0, among the pieces of information recorded in the memory 25. For example, when a pressure P0A associated with the elapsed time 0 in the information A is closer to the measured pressure P0 than a pressure P0B associated with the elapsed time 0 in the information B, the control unit 20 selects the information A. Alternatively, the control unit 20 may select specific information at step ST12.

In the present embodiment, similarly to Embodiment 1, at the elapsed time T1 illustrated in FIG. 6, the pressure measurement at step ST14 of the first iteration is performed and the control unit 20 records the elapsed time T1 and the measured pressure P1 in the memory 25. In the present embodiment, a constant time Tc illustrated in FIGS. 17 and 18 is the duration from step ST12 to step ST14 of the first iteration, in other words, from the elapsed time 0 to the elapsed time T1.

Subsequently, the control unit 20 performs step ST15 in a manner same as that in Embodiment 1. Subsequently, at step ST16a of the first iteration, when the time from the elapsed time 0 at which the pressure P0 is measured to the elapsed time T1 at which the pressure P1 is measured is equal to or longer than a predetermined time Ts illustrated in FIGS. 17 and 18, the control unit 20 proceeds to step ST16b. When the time from the elapsed time 0 to the elapsed time T1 is shorter than the predetermined time Ts, the control unit 20 proceeds to step ST16c. The predetermined time Ts is longer than the constant time Tc as the time from step ST12 to step ST14 of the first iteration. Thus, at step ST16a of the first iteration, the control unit 20 proceeds to step ST16c.

At step ST16b, information recorded in the memory 25 is selected as described later.

At step ST16c, the control unit 20 predicts the time until the internal space of the chamber 10 reaches the predetermined pressure based on the selected information. The time is a time until the elapsed time TL illustrated in FIGS. 17 and 18. However, the elapsed time TL in the information A and the elapsed time TL in the information B may be different from each other. For example, at step ST12, when the information A is selected, the control unit 20 predicts, as the time until the internal space of the chamber 10 reaches the predetermined pressure, the time until the elapsed time TL illustrated in FIG. 17 at step ST16c of the first iteration.

Subsequently at step ST17, similarly to Embodiment 1, the control unit 20 outputs a signal related to information based on the predicted time to the output unit 21.

Subsequently, the control unit 20 proceeds to step ST14 of the second iteration to perform pressure measurement at the elapsed time T2 and record the elapsed time T2 and the measured pressure P2 in the memory 25. In the present embodiment, the constant time Tc is the duration from the latest step ST14 to the next step ST14. Thus, the constant time Tc is the time from the elapsed time T1 at which step ST14 of the first iteration is performed to the elapsed time T2 at which step ST14 of the second iteration is performed.

When the pressure in the internal space of the chamber 10 is lower than the threshold at step ST15 of the second iteration, the control unit 20 proceeds to step ST16a of the second iteration. At step ST16a of the second iteration, when the time from the elapsed time 0 at which the pressure is measured right before the currently selected information is selected to the elapsed time T2 at which the pressure is measured at step ST14 of the second iteration is equal to or longer than the predetermined time Ts, the control unit 20 proceeds to step ST16b. When the time from the elapsed time 0 to the elapsed time T2 is shorter than the predetermined time Ts, the control unit 20 proceeds to step ST16c. In the examples illustrated in FIGS. 17 and 18, the time from the elapsed time 0 to the elapsed time T2 is shorter than the predetermined time Ts, and thus the control unit 20 proceeds to step ST16c at step ST16a of the second iteration. Then, similarly to step ST16c of the first iteration, the control unit 20 predicts the time until the internal space of the chamber 10 reaches the predetermined pressure, and outputs a signal related to information based on the predicted time to the output unit 21 at step ST17.

The following describes step ST16a of the n-th iteration. When the time until step ST14 of the n-th iteration since an elapsed time at which the pressure is measured right before the information selected at step ST16a of the n-th iteration is selected is equal to or longer than the predetermined time Ts, the control unit 20 proceeds to step ST16b. For example, as illustrated in FIGS. 17 and 18, when the time until step ST14 of the third iteration since the pressure is measured at the elapsed time 0 is equal to or longer than the predetermined time Ts, the control unit 20 proceeds to step ST16b at step ST16a of the third iteration. In this example in which the predetermined time Ts is three times longer than the constant time Tc, information is selected at step ST16a of the n-th iteration as follows. Specifically, when information is selected at step ST16b following the pressure measurement at step ST14 of the (n-3)-th iteration, the control unit 20 proceeds to step ST16b at step ST16a following the pressure measurement at step ST14 of the n-th iteration three iterations after. Thus, the control unit 20 proceeds to step ST16b at step ST16a not at each iteration but at each predetermined time Ts.

The following describes the information selection at step ST16b. At step ST16b, the control unit 20 selects information including the relation between the elapsed time since the start of the predetermined duration and the pressure measured in the predetermined duration, which is closest to a relation recorded in the memory 25. In the present embodiment, the start of the predetermined duration is the start of operation of the EUV light generation apparatus 100 at step ST12, but similarly to Embodiment 1, the start of the predetermined duration may be the timing of the first emission of the EUV light 101.

In the information selection, for example, the root-mean-square of the difference between the pressure measured at step ST14 and a pressure recorded in the memory 25 may be used. In this case, for each information, the control unit 20 calculates the root-mean-square of the difference between the corresponding one of pressures measured at a plurality of elapsed times and the corresponding one of pressures recorded for the respective elapsed times in the memory 25, and selects information including the smallest root-mean-square. For example, when the information A and the information B illustrated in FIGS. 17 and 18 are recorded in the memory 25, a root-mean-square XnA of the difference between the pressure Pn measured at step ST14 of the n-th iteration and a pressure PnA associated with the n-th iteration in the information A is given by Expression (1) below. In addition, a root-mean-square XnB of the difference between the pressure Pn measured at step ST14 of the n-th iteration and a pressure PnB associated with the n-th iteration in the information B is given by Expression (2) below. In FIGS. 17 and 18, the measured pressure Pn is illustrated with a dotted line. In the expressions below, Pk represents a pressure measured in the k-th iteration, PkA represents a pressure associated with the k-th iteration in the information A, and PkB represents a pressure associated with the k-th iteration in the information B.

$$XnA = \sqrt{\frac{1}{n}\sum_{k=1}^{n}(Pk - PkA)^2} \quad (1)$$

$$XnB = \sqrt{\frac{1}{n}\sum_{k=1}^{n}(Pk - Pkb)^2} \quad (2)$$

The control unit 20 calculates the root-mean-squares XnA and XnB. Then, the control unit 20 compares the value of the root-mean-square XnA and the value of the root-mean-square XnB. Then, the control unit 20 selects, as information closest to the relation between the elapsed time and the measured pressure, information including the smallest calculated root-mean-square, among the information A and the information B in the memory 25. When m pieces of information are recorded in the memory 25, the control unit 20 calculates m root-mean-squares and selects information including the smallest root-mean-square, among the m pieces of information.

Then, the control unit 20 predicts the time until the internal space of the chamber 10 reaches the predetermined pressure by using the selected information in the memory 25. In this case, each information recorded in the memory 25 may include a time until the predetermined pressure is reached based on the past record.

In the present embodiment, the information selection at step ST16b is performed via step ST16a. However, step ST16a is not essential and the information selection at step ST16b may be performed each time the pressure in the internal space of the chamber 10 is measured at step ST14. In the information selection at step ST16c, a value other than the root-mean-square may be used.

8.2 Effect In the present embodiment, an approximate time until maintenance becomes needed can be predicted by using a plurality of pieces of information recorded in the memory 25.

9. Embodiment 6

9.1 Operation of Extreme Ultraviolet Light Generation Apparatus of Embodiment 6

The configuration of an extreme ultraviolet light generation apparatus of Embodiment 6 will be described below. Any component same as that described above is denoted by an identical reference sign, and duplicate description thereof is omitted unless specific description is needed. The configuration of the extreme ultraviolet light generation apparatus of the present embodiment is same as the configuration of the extreme ultraviolet light generation apparatus of Embodiment 2, and thus description thereof is omitted.

Figure 19:
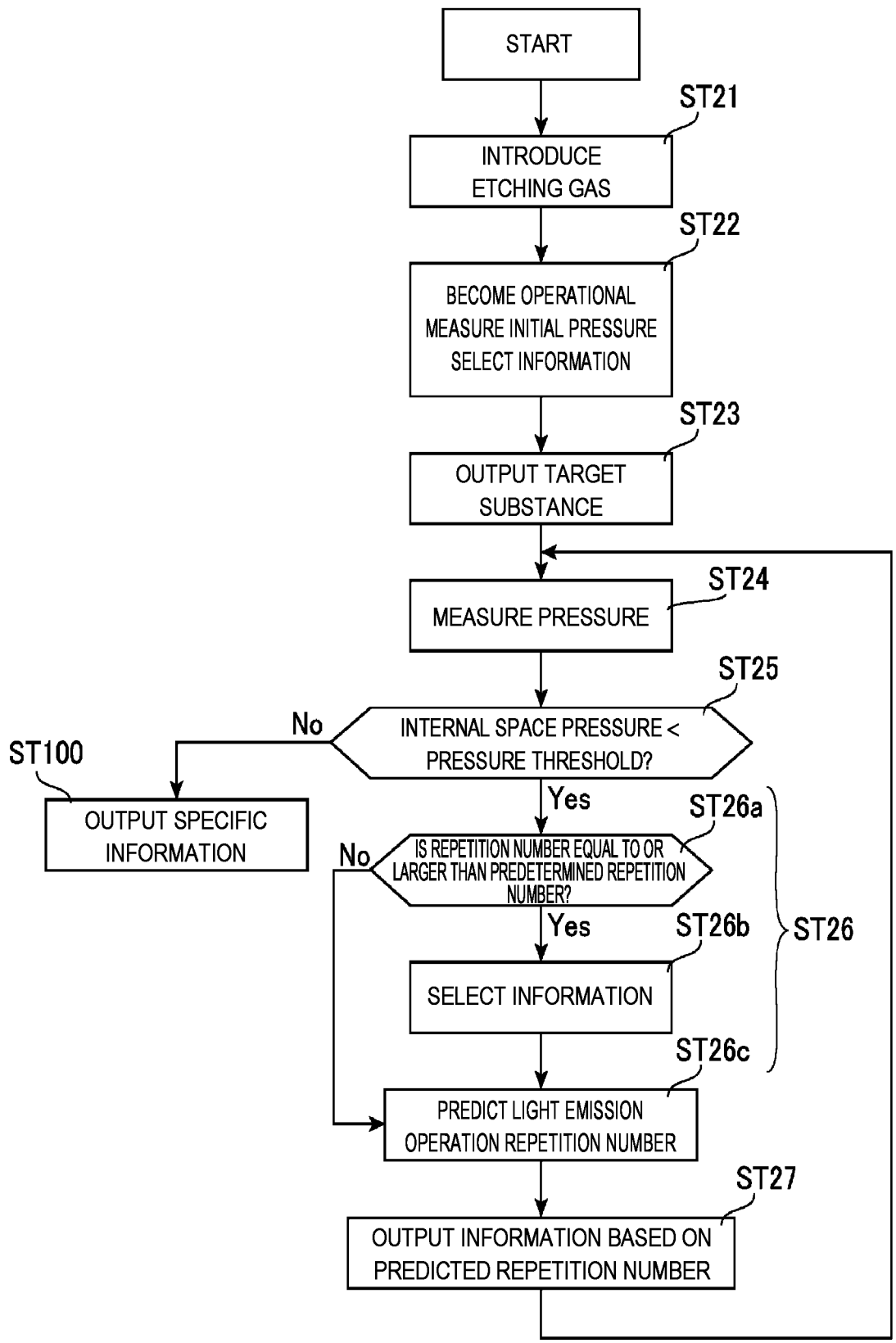
FIG. 19 is a flowchart schematically illustrating operation of the extreme ultraviolet light generation apparatus in Embodiment 6.

FIG. 19 is a flowchart schematically illustrating operation of the extreme ultraviolet light generation apparatus in Embodiment 6. In the EUV light generation apparatus 100 according to the present embodiment, step ST26 includes steps ST26a to ST26c, which is a main difference from the EUV light generation apparatus 100 of Embodiment 2.

Figure 20:
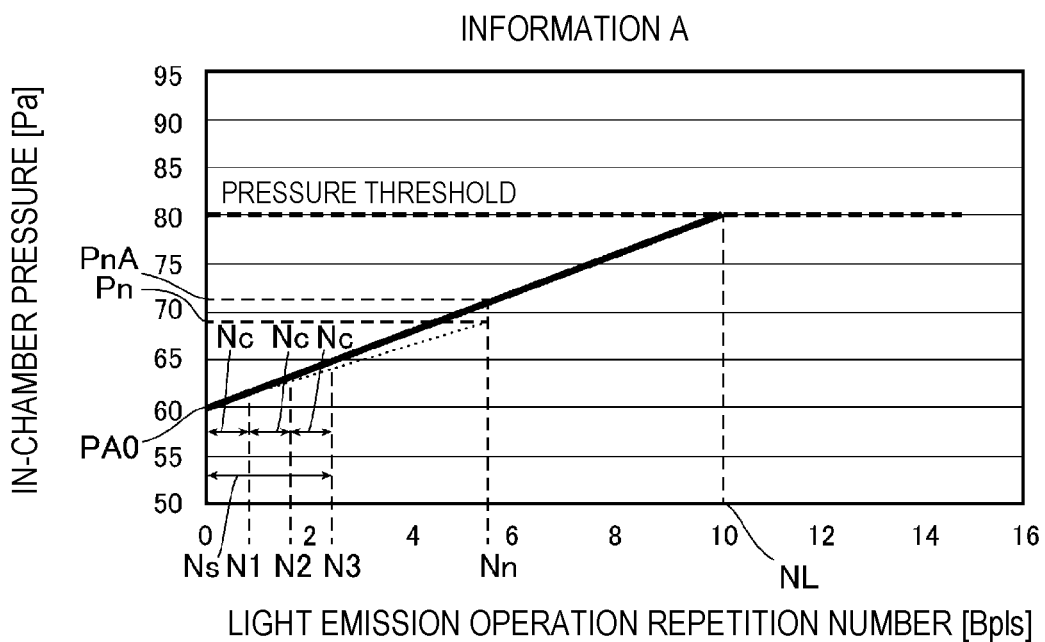
FIG. 20 is a schematic diagram obtained by visualizing exemplary information recorded in the memory.
Figure 21:
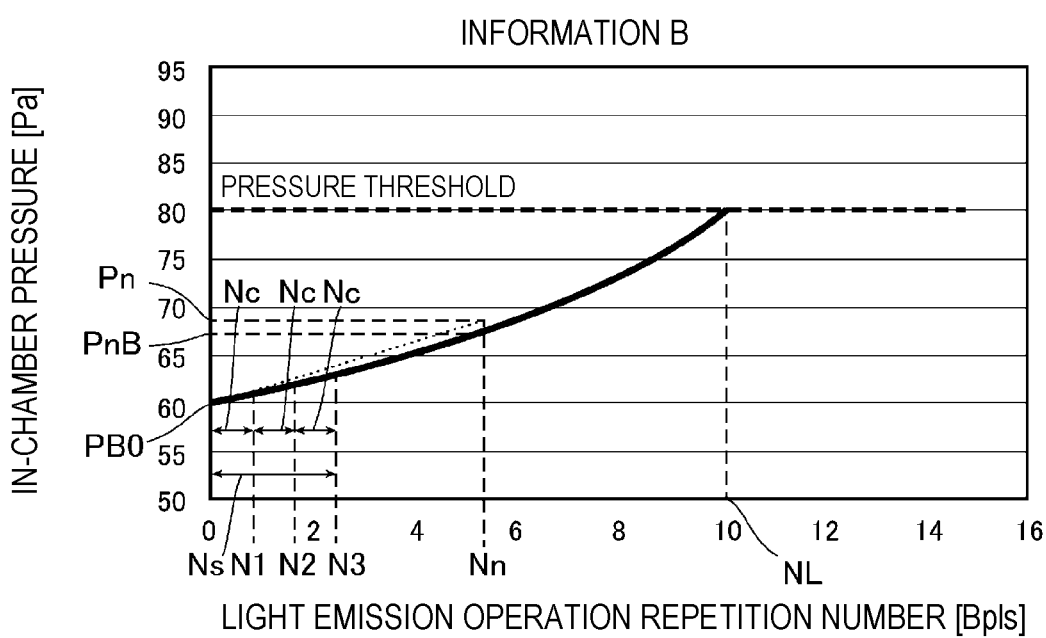
FIG. 21 is a schematic diagram obtained by visualizing other exemplary information recorded in the memory.

The memory 25 according to the present embodiment records a plurality of pieces of information including the relation between the number of repetitions of light emission operation of EUV light and the pressure. FIG. 20 is a schematic diagram obtained by visualizing exemplary information recorded in the memory 25. In FIG. 20, the relation between the number of repetitions of light emission operation and the pressure, which is recorded in the memory 25, is indicated as a linear function. In other words, such a function or a matrix table of the number of repetitions of light emission operation and the pressure, which indicates the function, is recorded in the memory 25 as the information. This information is referred to as information A. FIG. 21 is a schematic diagram obtained by visualizing another exemplary information recorded in the memory 25. In FIG. 21, the relation between the number of repetitions of light emission operation and the pressure, which is recorded in the memory 25, is indicated as a curved function. In other words, such a function or a matrix table of the number of repetitions of light emission operation and the pressure, which indicates the function, is recorded in the memory 25 as the information. This information is referred to as information B. The memory 25 according to the present embodiment records, for example, the information A illustrated in FIG. 20, the information B illustrated in FIG. 21, and information of another relation between the number of repetitions of light emission operation and the pressure. In this manner, the memory 25 according to the present embodiment records the pieces of information including the relation between the number of repetitions of light emission operation and the pressure as described above.

In the present embodiment, at step ST22, the control unit 20 selects specific information based on the pressure P0 measured at the light emission operation repetition number 0 of the EUV light 101 illustrated in FIG. 9 after the EUV light generation apparatus 100 has become operational. In this case, the control unit 20 may select information including the pressure P0 associated with the light emission operation repetition number 0 that is closest to the measured pressure P0, among the pieces of information recorded in the memory 25. For example, when a pressure P0A associated with the light emission operation repetition number 0 in the information A is closer to the measured pressure P0 than a pressure P0B associated with the light emission operation repetition number 0 in the information B, the control unit 20 selects the information A. Alternatively, the control unit 20 may select specific information at step ST22.

In the present embodiment, similarly to Embodiment 2, at the light emission operation repetition number N1 illustrated in FIG. 9, the pressure measurement at step ST24 of the first iteration is performed and the control unit 20 records the light emission operation repetition number N1 and the measured pressure P1 in the memory 25. In the present embodiment, a constant repetition number Nc illustrated in FIGS. 20 and 21 corresponds to the duration from step ST22 to step ST24 of the first iteration, in other words, the duration from the light emission operation repetition number 0 to the light emission operation repetition number N1.

Subsequently, the control unit 20 performs step ST25 in a manner same as that in Embodiment 2. Subsequently at step ST26a of the first iteration, when the number of repetitions of light emission operation between the light emission operation repetition number 0 when the pressure P0 is measured and the light emission operation repetition number N1 when the pressure P1 is measured is equal to or larger than a predetermined repetition number Ns illustrated in FIGS. 20 and 21, the control unit 20 proceeds to step ST26b. When the number of repetitions of light emission operation between the light emission operation repetition number 0 and the light emission operation repetition number N1 is smaller than the predetermined repetition number Ns, the control unit 20 proceeds to step ST26c. The predetermined repetition number Ns is larger than the constant repetition number Nc as the number of repetitions of light emission operation from step ST22 to step ST24 of the first iteration. Thus, at step ST26a of the first iteration, the control unit 20 proceeds to step ST26c.

At step ST26b, information recorded in the memory 25 is selected as described later.

At step ST26c, the control unit 20 predicts the number of repetitions of light emission operation until the internal space of the chamber 10 reaches the predetermined pressure based on the selected information. The number of repetitions of light emission operation is the number of repetitions until a light emission operation repetition number NL illustrated in FIGS. 20 and 21 is reached. However, the light emission operation repetition number NL in the information A and the light emission operation repetition number NL in the information B may be different from each other. For example, at step ST22, when the information A is selected, the control unit 20 predicts, as the number of repetitions of light emission operation until the internal space of the chamber 10 reaches the predetermined pressure, the number of repetitions until the light emission operation repetition number NL illustrated in FIG. 20 is reached at step ST26c of the first iteration.

Subsequently at step ST27, similarly to Embodiment 2, the control unit 20 outputs a signal related to information based on the predicted number of repetitions of light emission operation to the output unit 21.

Subsequently, the control unit 20 proceeds to step ST24 of the second iteration to perform pressure measurement at the light emission operation repetition number N2 and record the light emission operation repetition number N2 and the measured pressure P2 in the memory 25. In the present embodiment, the constant repetition number Nc is the number of repetitions of light emission operation from the latest step ST24 to the next step ST24. Thus, the constant repetition number Nc is the number of repetitions of light emission operation between the light emission operation repetition number N1 when step ST24 of the first iteration is performed and the light emission operation repetition number N2 when step ST24 of the second iteration is performed.

When the pressure in the internal space of the chamber 10 is lower than the threshold at step ST25 of the second iteration, the control unit 20 proceeds to step ST26a of the second iteration. At step ST26a of the second iteration, when the number of repetitions of light emission operation from the timing when the pressure is measured right before currently selected information is selected to the timing when the pressure is measured at step ST24 of the second iteration is equal to or larger than the predetermined repetition number Ns, the control unit 20 proceeds to step ST26b. In other words, when the difference between the light emission operation repetition number 0 and the light emission operation repetition number N2 is equal to or larger than the predetermined repetition number Ns, the control unit 20 proceeds to step ST26b. When the difference between the light emission operation repetition number 0 and the light emission operation repetition number N2 is smaller than the predetermined repetition number Ns, the control unit 20 proceeds to step ST26c. In the examples illustrated in FIGS. 20 and 21, the difference between the light emission operation repetition number 0 and the light emission operation repetition number N2 is smaller than the predetermined repetition number Ns, and thus the control unit 20 proceeds to step ST26c at step ST26a of the second iteration. Then, similarly to step ST26c of the first iteration, the control unit 20 predicts the number of repetitions of light emission operation until the internal space of the chamber 10 reaches the predetermined pressure, and outputs a signal related to information based on the predicted number of repetitions of light emission operation to the output unit 21 at step ST27.

The following describes step ST26a of the n-th iteration. When the number of repetitions of light emission operation between the light emission operation repetition number when the pressure is measured right before the information selected at step ST26a of the n-th iteration is selected and the light emission operation repetition number at step ST24 of the n-th iteration is equal to or larger than the predetermined repetition number Ns, the control unit 20 proceeds to step ST26b. For example, as illustrated in FIGS. 20 and 21, when the number of repetitions of light emission operation until step ST24 of the third iteration since the pressure is measured at the light emission operation repetition number 0 is equal to or larger than the predetermined repetition number Ns, the control unit 20 proceeds to step ST26b at step ST26a of the third iteration. In this example in which the predetermined repetition number Ns is three times larger than the constant repetition number Nc, information is selected at step ST26a of the n-th iteration as follows. Specifically, when information is selected at step ST26b following the pressure measurement at step ST24 of the (n-3)-th iteration, the control unit 20 proceeds to step ST26b at step ST26a following the pressure measurement at step ST24 of the n-th iteration three iterations after. Thus, at step ST26a, the control unit 20 proceeds to step ST26b not at each iteration but at each predetermined repetition number Ns.

The following describes the information selection at step ST26b. At step ST26b, the control unit 20 selects information including the relation between the number of repetitions of light emission operation since the start of the predetermined duration and the pressure measured in the predetermined duration, which is closest to a relation recorded in the memory 25. In the present embodiment, the start of the predetermined duration is the start of operation of the EUV light generation apparatus 100 at step ST22.

In the information selection, for example, the root-mean-square of the difference between the pressure measured at step ST24 and a pressure recorded in the memory 25 may be used. In this case, for each information, the control unit 20 calculates the root-mean-square of the difference between a pressure measured at each of a predetermined number of repetitions of light emission operation and a pressure recorded in the memory 25 for the light emission operation repetition number, and selects information including the smallest root-mean-square. For example, when the information A and the information B illustrated in FIGS. 20 and 21 are recorded in the memory 25, a root-mean-square XnA of the difference between the pressure Pn measured at step ST24 of the n-th iteration and a pressure PnA associated with the n-th iteration in the information A is given in Expression (1) above. In addition, a root-mean-square XnB of the difference between the pressure Pn measured at step ST24 of the n-th iteration and a pressure PnB associated with the n-th iteration in the information B is given by Expression (2) above. In FIGS. 20 and 21, the measured pressure Pn is illustrated with a dotted line.

The control unit 20 calculates the root-mean-squares XnA and XnB. Then, the control unit 20 compares the value of the root-mean-square XnA and the value of the root-mean-square XnB thus calculated. Then, the control unit 20 selects, as information closest to the relation between the number of repetitions of light emission operation and the measured pressure, information including the smallest calculated root-mean-square, among the information A and the information B in the memory 25. When m pieces of information are recorded in the memory 25, the control unit 20 calculates m root-mean-squares and selects information including the smallest root-mean-square, among the m pieces of information.

Then, the control unit 20 predicts the number of repetitions of light emission operation until the internal space of the chamber 10 reaches the predetermined pressure by using the selected information in the memory 25. In this case, each information recorded in the memory 25 may include the number of repetitions of light emission operation until the predetermined pressure is reached based on the past record.

In the present embodiment, the information selection at step ST26b is performed via step ST26a. However, step ST26a is not essential and the information selection at step ST26b may be performed each time the pressure in the internal space of the chamber 10 is measured at step ST24. In the information selection at step ST26c, a value other than the root-mean-square may be used.

9.2 Effect

In the present embodiment, an approximate time until maintenance becomes needed can be predicted by using a plurality of pieces of information recorded in the memory 25.

The description above is intended to be illustrative and the present disclosure is not limited thereto. Therefore, it would be obvious to those skilled in the art that various modifications to the embodiments of the present disclosure would be possible without departing from the spirit and the scope of the appended claims. Further, it would be also obvious for those skilled in the art that embodiments of the present disclosure would be appropriately combined.

The terms used throughout the present specification and the appended claims should be interpreted as non-limiting terms. For example, terms such as "comprise", "include", "have", and "contain" should not be interpreted to be exclusive of other structural elements. Further, indefinite articles "a/an" described in the present specification and the appended claims should be interpreted to mean "at least one" or "one or more". Further, "at least one of A, B, and C" should be interpreted to mean any of A, B, C, A+B, A+C, B+C, and A+B+C as well as to include combinations of the any thereof and any other than A, B, and C.

What is claimed is:

1. An extreme ultraviolet light generation apparatus comprising:
   a chamber having an internal space in which extreme ultraviolet light is generated when a target substance supplied to the internal space is irradiated with a laser beam;
   a gas supply unit configured to supply etching gas to the internal space;
   a discharge unit configured to discharge residual gas from the internal space;
   a pressure sensor configured to measure a pressure in the internal space; and
   a control unit,
   the control unit being configured to predict a time until the pressure in the internal space reaches a predetermined pressure by using a relation between an elapsed time since start of a predetermined duration including a duration in which the extreme ultraviolet light is generated and the pressure measured in the predetermined duration.

2. The extreme ultraviolet light generation apparatus according to claim 1, further comprising an output unit, wherein the control unit outputs information based on the predicted time to the output unit.

3. The extreme ultraviolet light generation apparatus according to claim 2, wherein the control unit outputs specific information to the output unit when the measured pressure is higher than the predetermined pressure.

4. The extreme ultraviolet light generation apparatus according to claim 3, wherein, when outputting the specific information to the output unit, the control unit outputs information indicating accumulation of substances attributable to the target substance in the discharge unit to the output unit.

5. The extreme ultraviolet light generation apparatus according to claim 2, wherein the control unit outputs specific information to the output unit when a change rate of the pressure for a predetermined time exceeds a predetermined change rate.

6. The extreme ultraviolet light generation apparatus according to claim 5, wherein, when outputting the specific information to the output unit, the control unit outputs information indicating occurrence of unexpected anomaly to the output unit.

7. The extreme ultraviolet light generation apparatus according to claim 1, wherein the control unit calculates the relation by using a least-square method from the pressure measured a plurality of times and the elapsed time until each pressure is measured.

8. The extreme ultraviolet light generation apparatus according to claim 1, further comprising a memory in which a plurality of pieces of information including the relation between the elapsed time and the pressure are recorded, wherein
   the control unit predicts the time until the internal space reaches the predetermined pressure by using the information including the relation recorded in the memory to which the relation between the elapsed time since the start of the predetermined duration and the pressure measured in the predetermined duration is closest.

9. An extreme ultraviolet light generation apparatus comprising:
   a chamber having an internal space in which extreme ultraviolet light is generated when a target substance supplied to the internal space is irradiated with a laser beam;
   a gas supply unit configured to supply etching gas to the internal space;
   a discharge unit configured to discharge residual gas from the internal space;
   a pressure sensor configured to measure a pressure in the internal space; and
   a control unit,
   the control unit being configured to predict a number of repetitions of light emission operation of the extreme ultraviolet light until the pressure in the internal space reaches a predetermined pressure by using a relation between the number of repetitions of light emission operation of the extreme ultraviolet light since start of a predetermined duration including a duration in which the extreme ultraviolet light is generated and the pressure measured in the predetermined duration.

10. The extreme ultraviolet light generation apparatus according to claim 9, wherein the control unit sets the number of repetitions of light emission operation to be a number of repetitions of light emission of the extreme ultraviolet light.

11. The extreme ultraviolet light generation apparatus according to claim 9, wherein the control unit sets the number of repetitions of light emission operation to be a number of emission signals input to a light source configured to emit the laser beam.

12. The extreme ultraviolet light generation apparatus according to claim 9, wherein the control unit sets the number of repetitions of light emission operation to be a number of repetitions of light emission of the laser beam.

13. The extreme ultraviolet light generation apparatus according to claim 9, further comprising an output unit, wherein the control unit outputs information based on the predicted number of repetitions to the output unit.

14. The extreme ultraviolet light generation apparatus according to claim 13, wherein the control unit outputs specific information to the output unit when the measured pressure is higher than the predetermined pressure.

15. The extreme ultraviolet light generation apparatus according to claim 14, wherein, when outputting the specific information to the output unit, the control unit outputs information indicating accumulation of substances attributable to the target substance in the discharge unit to the output unit.

16. The extreme ultraviolet light generation apparatus according to claim 13, wherein the control unit outputs specific information to the output unit when a change rate of the pressure for a predetermined increase value of the number of repetitions of light emission operation exceeds a predetermined change rate.

17. The extreme ultraviolet light generation apparatus according to claim 16, wherein, when outputting the specific information to the output unit, the control unit outputs information indicating occurrence of unexpected anomaly to the output unit.

18. The extreme ultraviolet light generation apparatus according to claim 9, wherein the control unit calculates the relation by using a least-square method from the pressure measured a plurality of times and the number of repetitions of light emission operation until each pressure is measured.

19. The extreme ultraviolet light generation apparatus according to claim 9, further comprising a memory in which a plurality of pieces of information including the relation between the number of repetitions of light emission operation and the pressure are recorded, wherein
the control unit predicts the number of repetitions of light emission operation of the extreme ultraviolet light until the internal space reaches the predetermined pressure by using the information including the relation recorded in the memory to which the relation between the number of repetitions of light emission operation of the extreme ultraviolet light since start of the predetermined duration and the pressure measured in the predetermined duration is closest.

20. An electronic device manufacturing method comprising:
generating extreme ultraviolet light by an extreme ultraviolet light generation apparatus;
outputting the extreme ultraviolet light to an exposure apparatus; and
exposing a photosensitive substrate to the extreme ultraviolet light in the exposure apparatus to manufacture an electronic device,
the extreme ultraviolet light generation apparatus including:
a chamber having an internal space in which extreme ultraviolet light is generated when a target substance supplied to the internal space is irradiated with a laser beam;
a gas supply unit configured to supply etching gas to the internal space;
a discharge unit configured to discharge residual gas from the internal space;
a pressure sensor configured to measure a pressure in the internal space; and
a control unit,
the control unit being configured to predict a number of repetitions of light emission operation of the extreme ultraviolet light until the pressure in the internal space reaches a predetermined pressure by using a relation between the number of repetitions of light emission operation of the extreme ultraviolet light since start of a predetermined duration including a duration in which the extreme ultraviolet light is generated and the pressure measured in the predetermined duration.

* * * * *